(12) United States Patent
Wang et al.

(10) Patent No.: US 12,501,687 B2
(45) Date of Patent: Dec. 16, 2025

(54) DUAL SILICIDE LAYERS IN SEMICONDUCTOR DEVICES

(71) Applicant: Taiwan Semiconductor Manufacturing Company, Ltd., Hsinchu (TW)

(72) Inventors: Chen-Han Wang, Zhubei (TW); Keng-Chu Lin, Ping-Tung (TW); Tsungyu Hung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 729 days.

(21) Appl. No.: 17/833,607

(22) Filed: Jun. 6, 2022

(65) Prior Publication Data
US 2023/0038822 A1 Feb. 9, 2023

Related U.S. Application Data

(60) Provisional application No. 63/229,156, filed on Aug. 4, 2021.

(51) Int. Cl.
| | |
|---|---|
| *H10D 84/01* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 84/03* | (2025.01) |

(52) U.S. Cl.
CPC ......... *H10D 84/013* (2025.01); *H10D 30/014* (2025.01); *H10D 30/43* (2025.01);
(Continued)

(58) Field of Classification Search
CPC .......... H01L 21/28097; H10D 30/01; H10D 30/014; H10D 30/019–0198;
(Continued)

(56) References Cited

U.S. PATENT DOCUMENTS

| | | | |
|---|---|---|---|
| 7,719,035 B2 | 5/2010 | Besser | |
| 9,093,530 B2 | 7/2015 | Huang et al. | |

(Continued)

FOREIGN PATENT DOCUMENTS

| | | |
|---|---|---|
| CN | 104051511 A | 9/2014 |
| TW | I-462228 B | 11/2014 |

(Continued)

*Primary Examiner* — Cheung Lee
(74) *Attorney, Agent, or Firm* — Sterne, Kessler, Goldstein & Fox P.L.L.C.

(57) ABSTRACT

A semiconductor device with different configurations of contact structures and a method of fabricating the same are disclosed. The method includes forming first and second fin structures on a substrate, forming n- and p-type source/drain (S/D) regions on the first and second fin structures, respectively, forming first and second oxidation stop layers on the n- and p-type S/D regions, respectively, epitaxially growing first and second semiconductor layers on the first and second oxidation stop layers, respectively, converting the first and second semiconductor layers into first and second semiconductor oxide layers, respectively, forming a first silicide-germanide layer on the p-type S/D region, and forming a second silicide-germanide layer on the first silicide-germanide layer and on the n-type S/D region.

20 Claims, 27 Drawing Sheets

(52) U.S. Cl.
CPC ..... *H10D 30/6735* (2025.01); *H10D 30/6757* (2025.01); *H10D 62/121* (2025.01); *H10D 62/151* (2025.01); *H10D 84/0128* (2025.01); *H10D 84/0158* (2025.01); *H10D 84/038* (2025.01)

(58) Field of Classification Search
CPC .... H10D 30/024; H10D 30/43; H10D 30/435; H10D 30/501–509; H10D 30/62; H10D 30/6219; H10D 30/6735; H10D 30/674; H10D 30/6757; H10D 30/797; H10D 62/121; H10D 62/151; H10D 64/01; H10D 64/251; H10D 64/258; H10D 64/668; H10D 64/669; H10D 84/01; H10D 84/0128; H10D 84/013; H10D 84/0158; H10D 84/017; H10D 84/038
See application file for complete search history.

(56) References Cited

U.S. PATENT DOCUMENTS

| | | |
|---|---|---|
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,831,183 B2 | 11/2017 | Lin et al. |
| 9,859,386 B2 | 1/2018 | Ho et al. |
| 11,264,485 B2 | 3/2022 | Wang et al. |
| 11,855,177 B2 | 12/2023 | Wei et al. |
| 12,040,372 B2 | 7/2024 | Hsu-Kai et al. |
| 2015/0243663 A1 | 8/2015 | Hung et al. |

FOREIGN PATENT DOCUMENTS

| | | |
|---|---|---|
| TW | 202117819 A | 5/2021 |
| TW | 202125834 A | 7/2021 |
| TW | 202207320 A | 2/2022 |

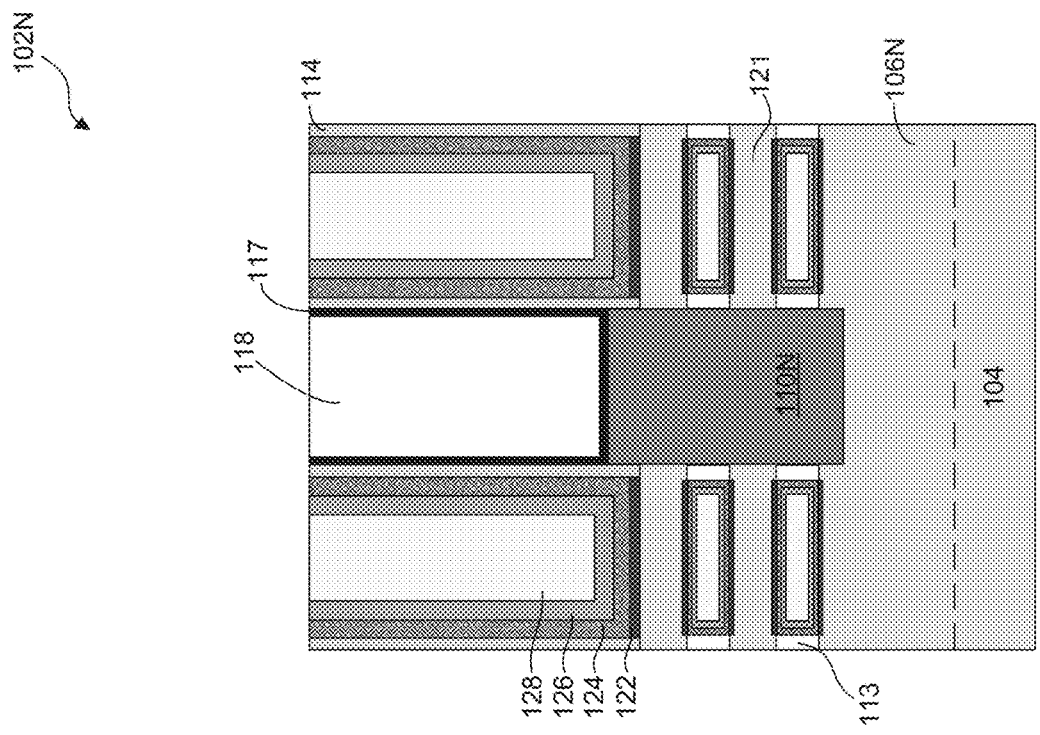
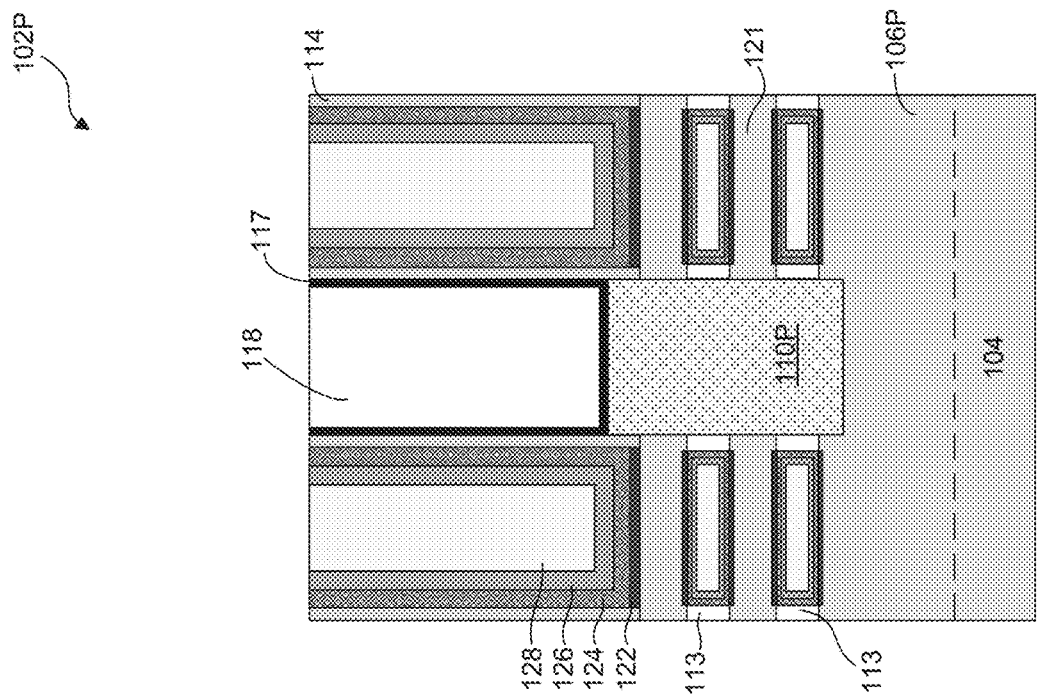

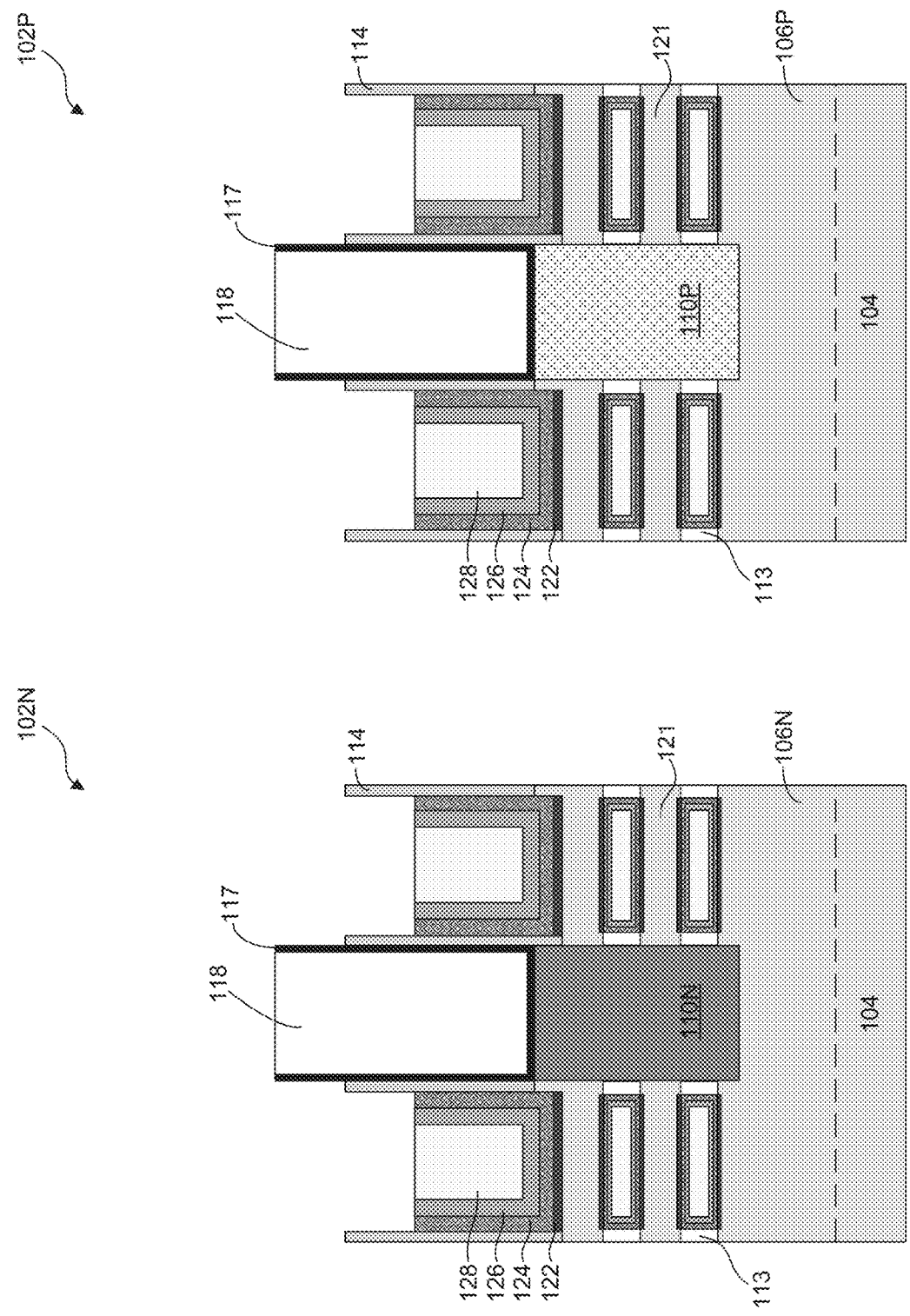

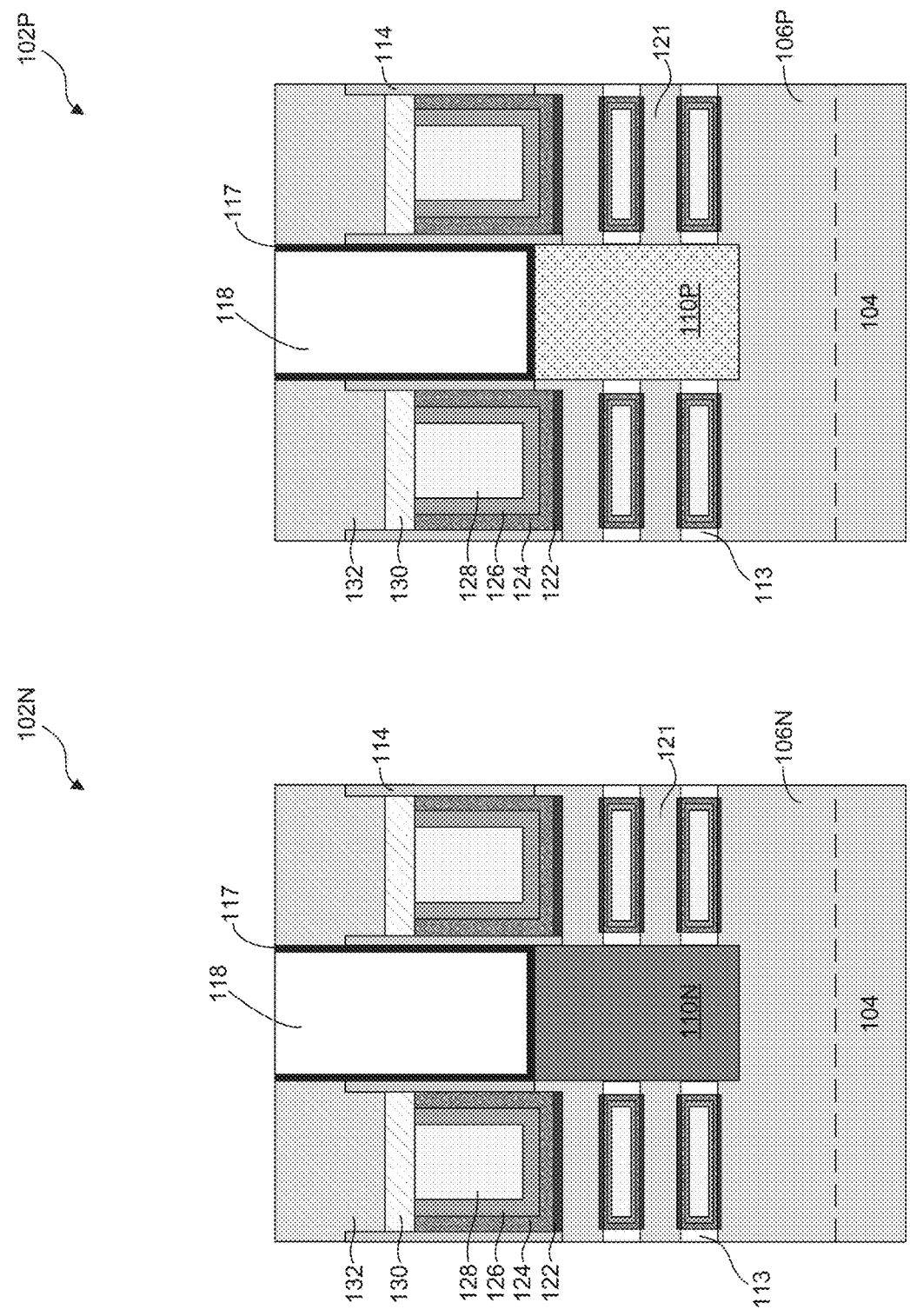

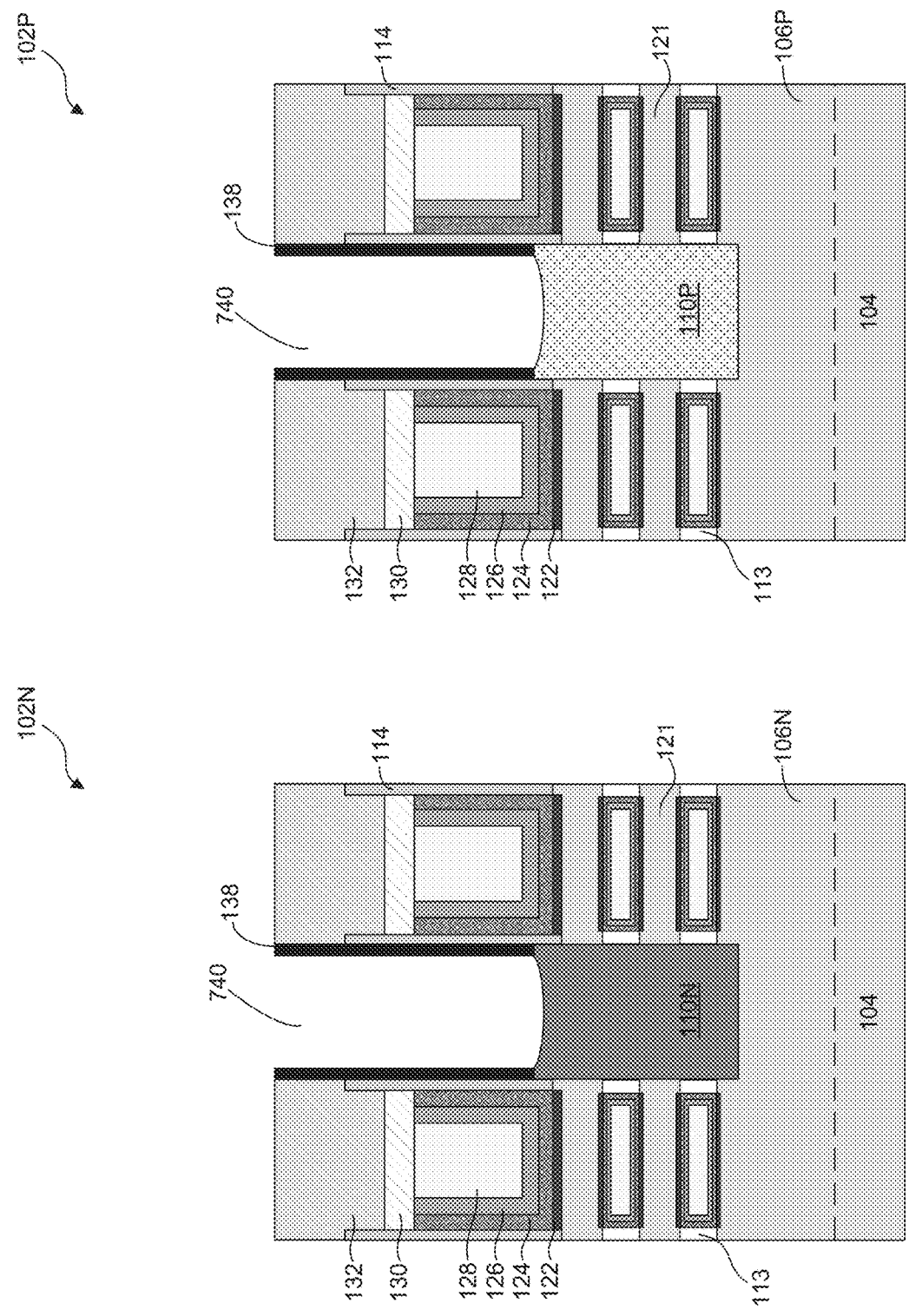

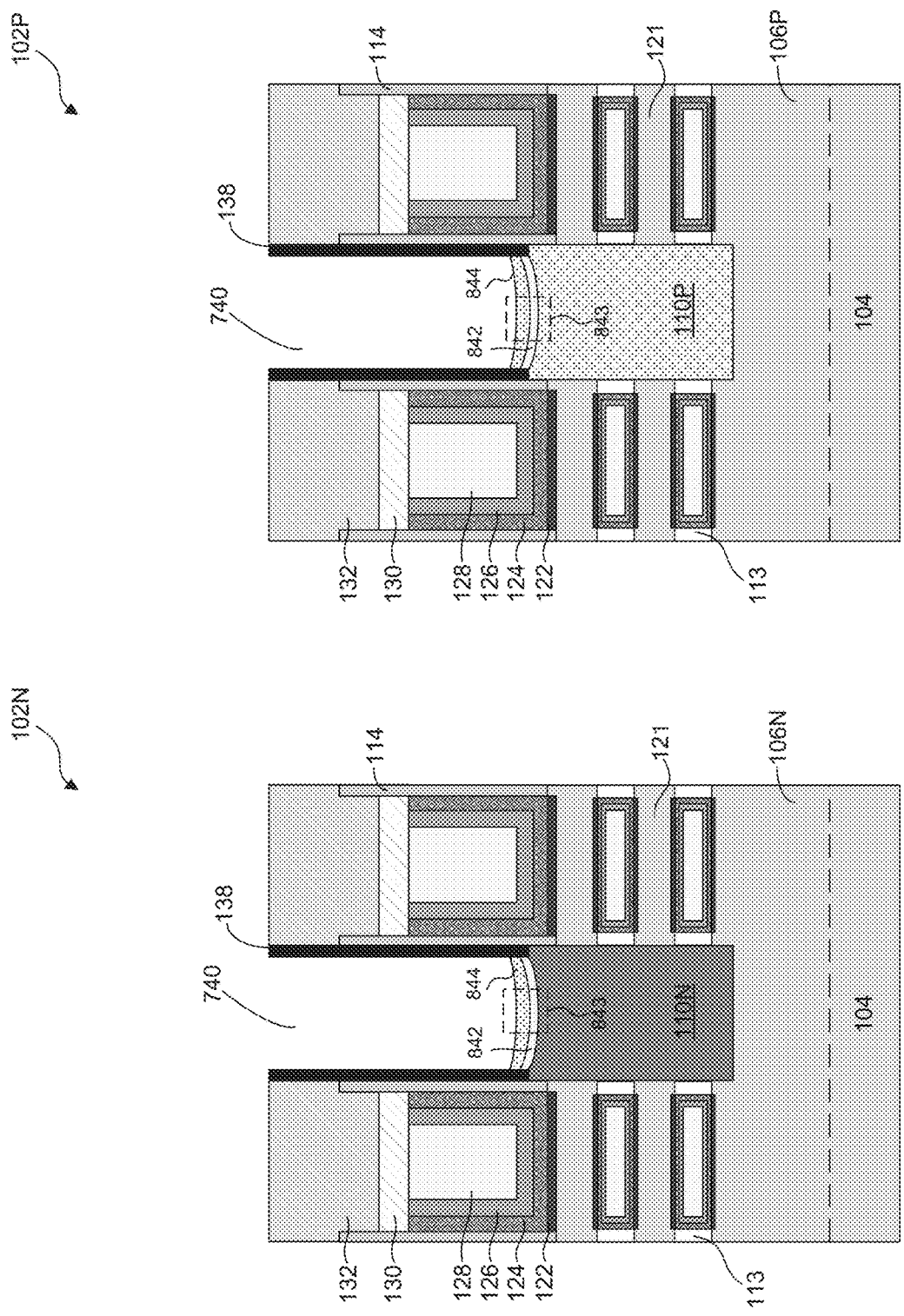

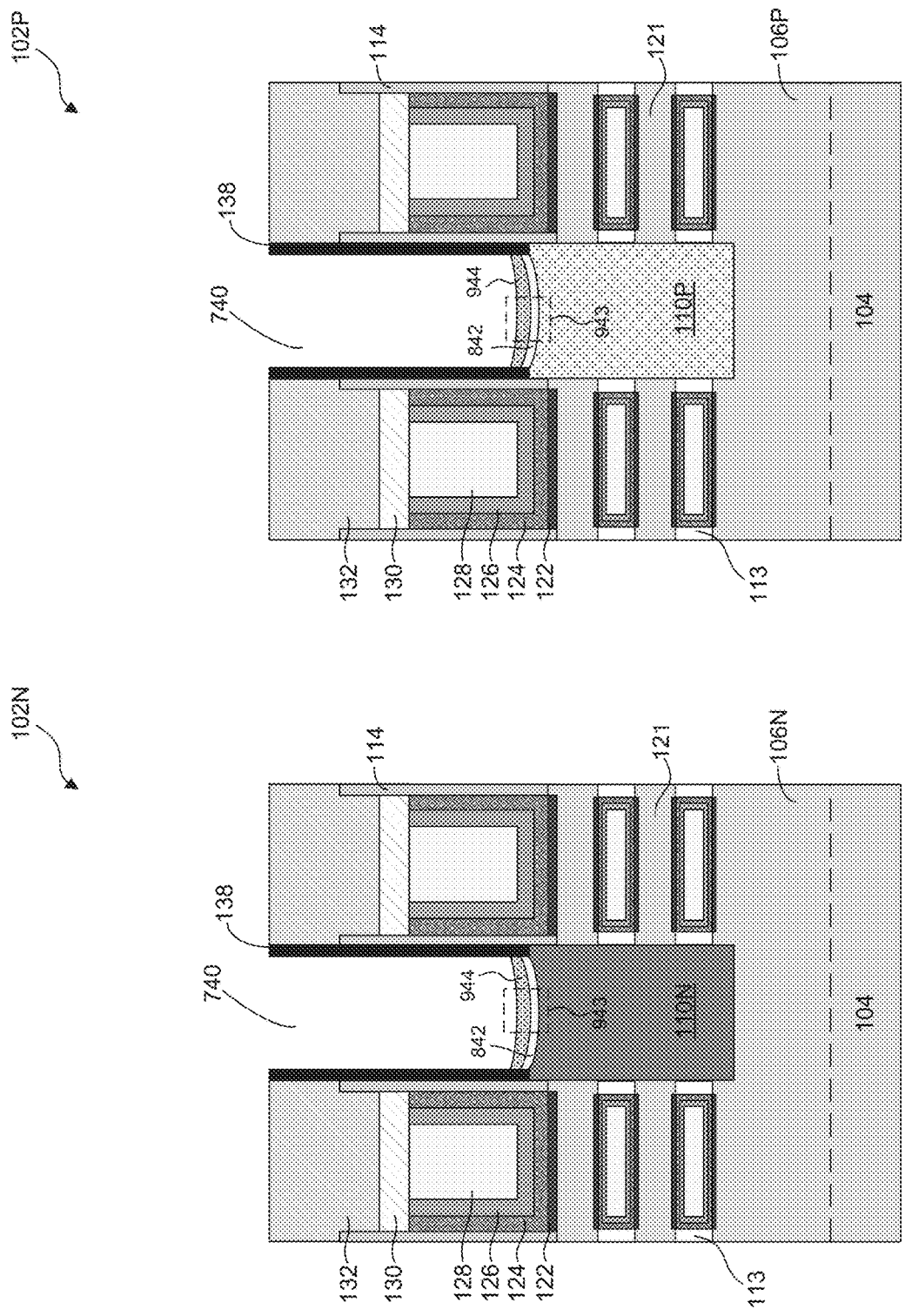

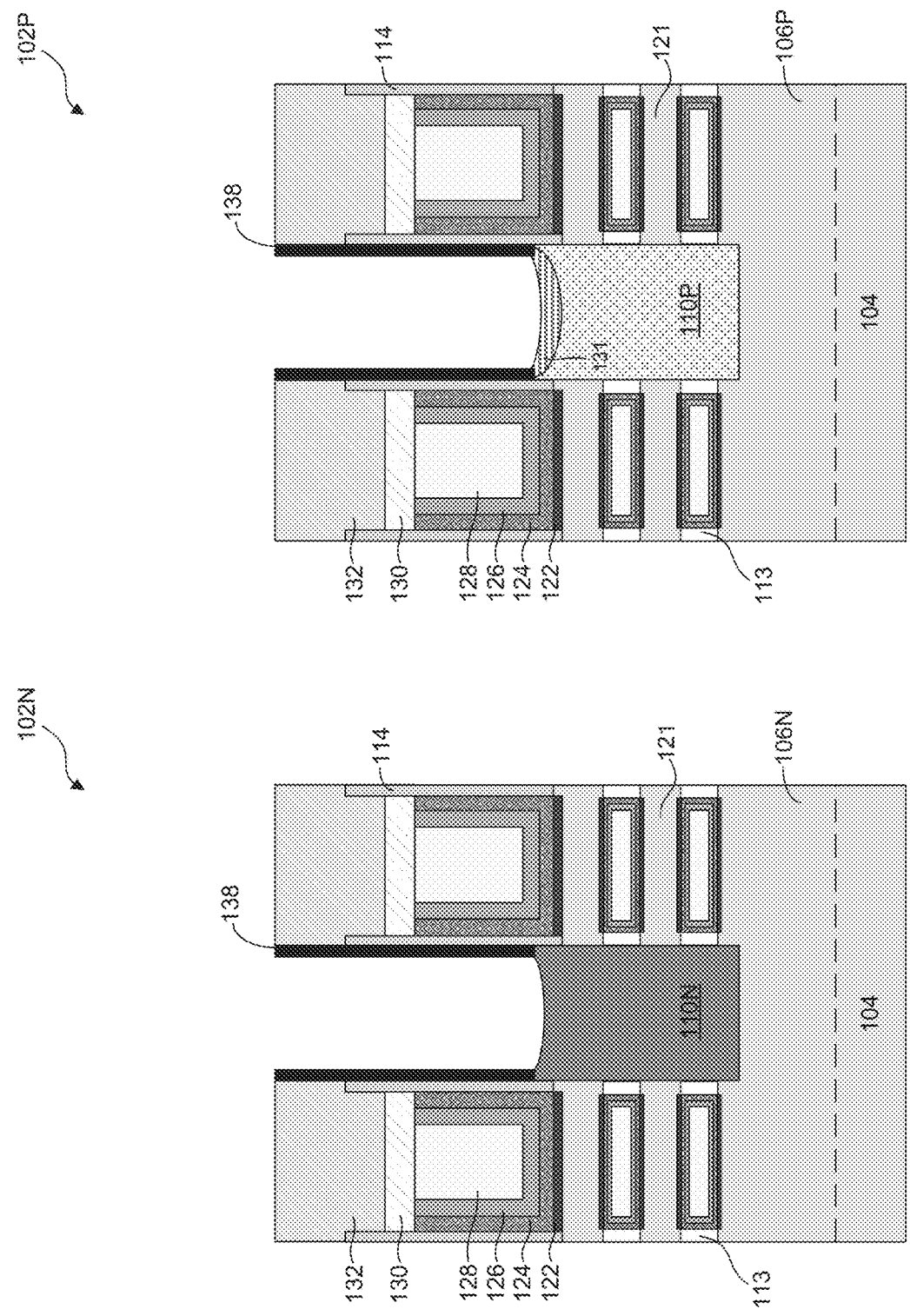

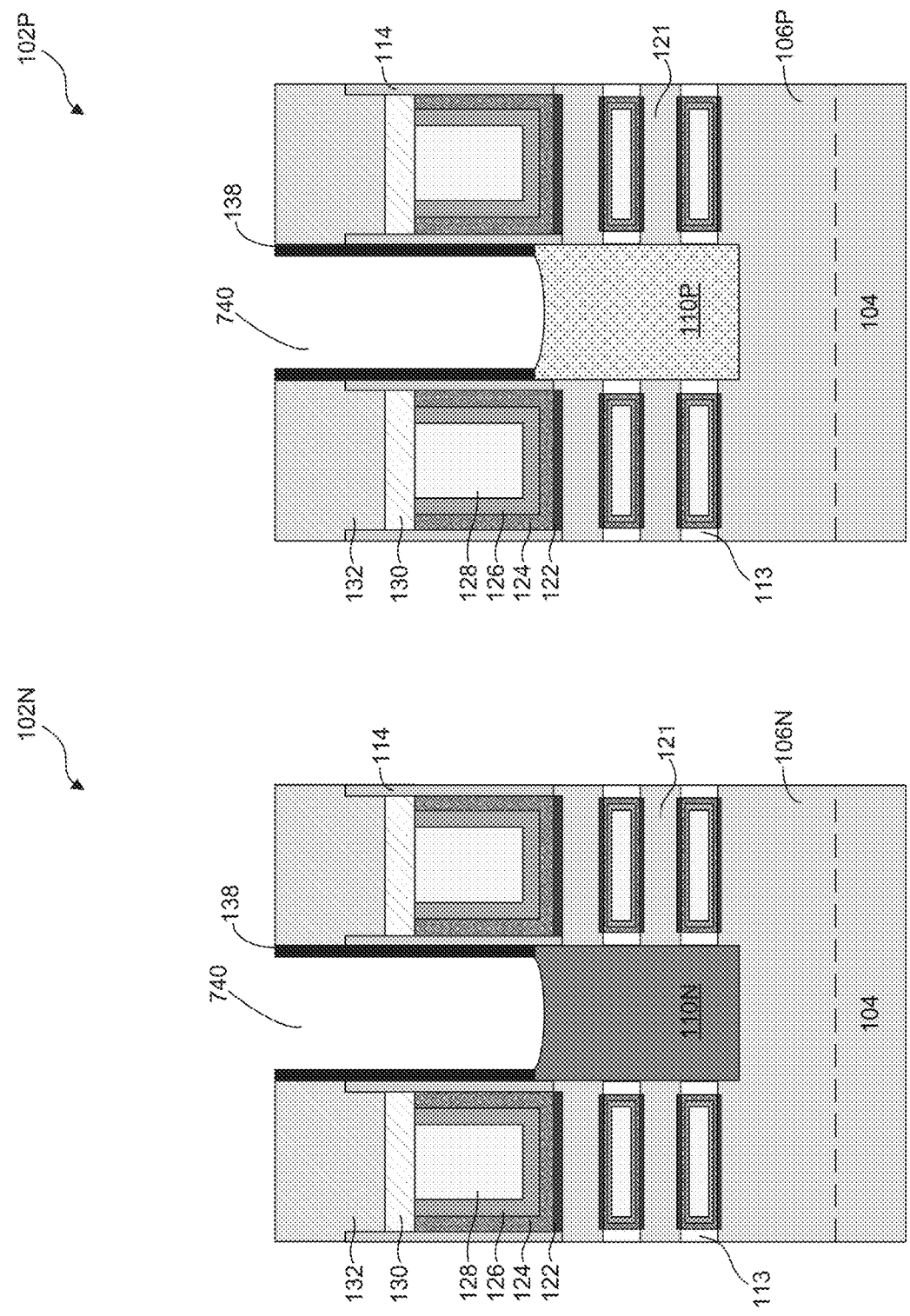

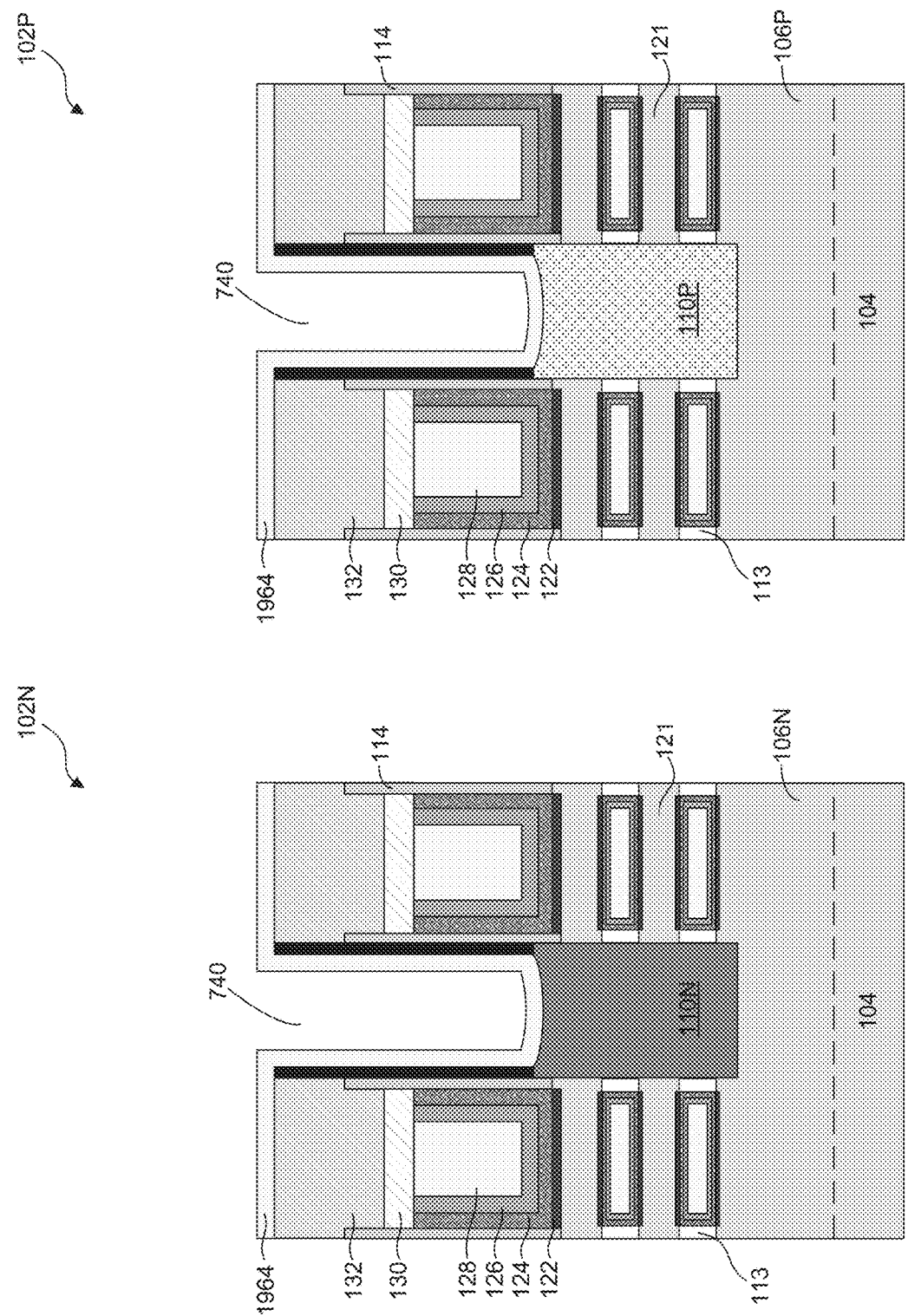

DUAL SILICIDE LAYERS IN SEMICONDUCTOR DEVICES

CROSS-REFERENCE TO RELATED APPLICATIONS

This application claims the benefit of U.S. Provisional Patent Application No. 63/229,156, titled "Semiconductor Structure having Dual Silicate and Method for Forming the Same," filed Aug. 4, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 3A-8B, 8C, 9A-9C, and 10A-16B illustrate cross-sectional views of a semiconductor device with different contact structures at various stages of its fabrication process, in accordance with some embodiments.

FIGS. 18A-24B illustrate cross-sectional views of a semiconductor device with different contact structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
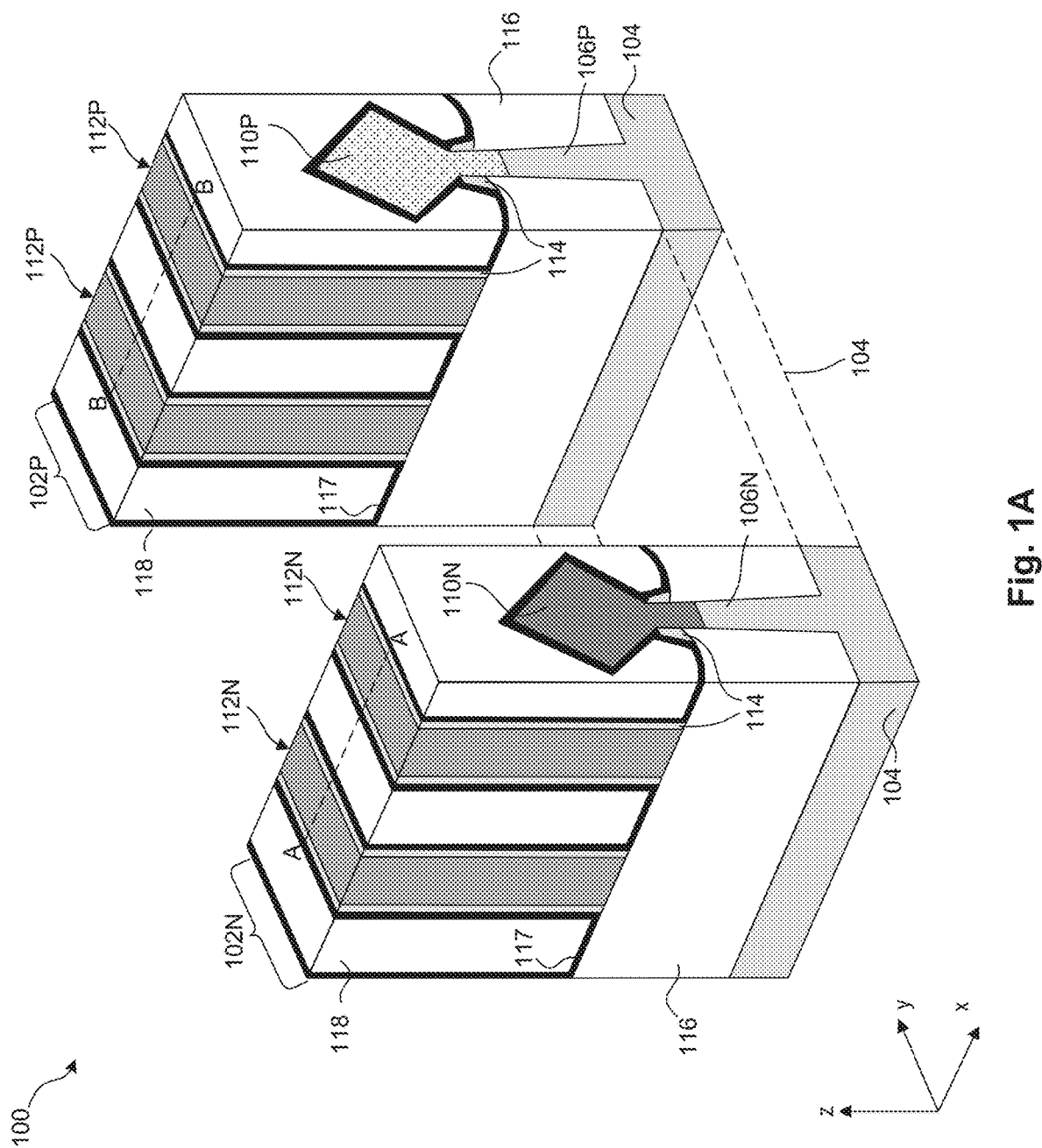
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example semiconductor devices with FETs (e.g., finFETs) having source/drain (S/D) contact structures different from each other and provides example methods of forming such contact structures with silicidation stop layers. The example method forms arrays of n- and p-type S/D regions on fin structures of n-type FETs (NFETs) and p-type FETs (PFETs), respectively, of the semiconductor device. In some embodiments, contact structures on n-type S/D regions have silicide layers (also referred to as "silicide-germanide layers" herein, unless mentioned otherwise) different from silicide layers of contact structures on p-type S/D regions.

The contact resistances between the S/D regions and the S/D contact structures are directly proportional to the Schottky barrier heights (SBHs) between the materials of the S/D regions and the silicide layers of the S/D contact structures. For n-type S/D regions, reducing the difference between the work function value of the silicide layers and the conduction band energy of the n-type material of the S/D regions can reduce the SBH between the n-type S/D regions and the S/D contact structures. In contrast, for p-type S/D regions, reducing the difference between the work function value of the silicide layers and the valence band energy of the p-type material of the S/D regions can reduce the SBH between the p-type S/D regions and the S/D contact structures. In some embodiments, since the S/D regions of NFETs and PFETs are formed with respective n-type and p-type materials, the S/D contact structures of NFETs and PFETs are formed with silicide layers different from each other to reduce the contact resistances between the S/D contact structures and the different materials of the S/D regions.

In some embodiments, the NFET S/D contact structures are formed with n-type work function metal (nWFM) silicide layers (e.g., titanium silicide-germanide) that have a work function value closer to a conduction band energy than a valence band energy of the n-type S/D regions. In contrast, the PFET S/D contact structures are formed with p-type WFM (pWFM) silicide layers (e.g., nickel silicide-germanide or cobalt silicide-germanide) that have a work function value closer to a valence band energy than a conduction band energy of the p-type S/D regions. The nWFM silicide layers can be formed from a silicidation reaction (or silicidation and germanidation reactions) between the n-type S/D regions and an nWFM layer disposed on the n-type S/D regions. The pWFM silicide layers can be formed from a silicidation reaction (or silicidation and germanidation reactions) between the p-type S/D regions and a pWFM layer disposed on the p-type S/D regions.

In some embodiments, the method of selectively forming pWFM silicide layers on p-type S/D regions includes forming silicidation stop layers on n-type S/D regions prior to depositing pWFM layers on the n- and p-type S/D regions. The silicidation stop layers can prevent silicidation reactions between the pWFM layers and the n-type S/D regions. In some embodiments, forming silicidation stop layers on the n-type S/D regions can include depositing or epitaxially growing a semiconductor material (e.g., silicon or silicon germanium (SiGe)) on the n-type S/D regions and oxidizing the semiconductor material. The semiconductor material has a stronger chemical bond with oxygen atoms than with the metal atoms of the pWFM layers. As a result, the oxidized semiconductor material of the silicidation stop layers does not react with the metal of the pWFM layers and prevents chemical interactions between the metal of the pWFM layers and the n-type S/D regions underlying the silicidation stop layers. In some embodiments, oxidation stop layers can be deposited or epitaxially grown between the silicidation stop layers and the n-type S/D regions to protect the material of the n-type S/D regions from oxidizing during the formation of the silicidation stop layers.

Figures 1B, 1C:
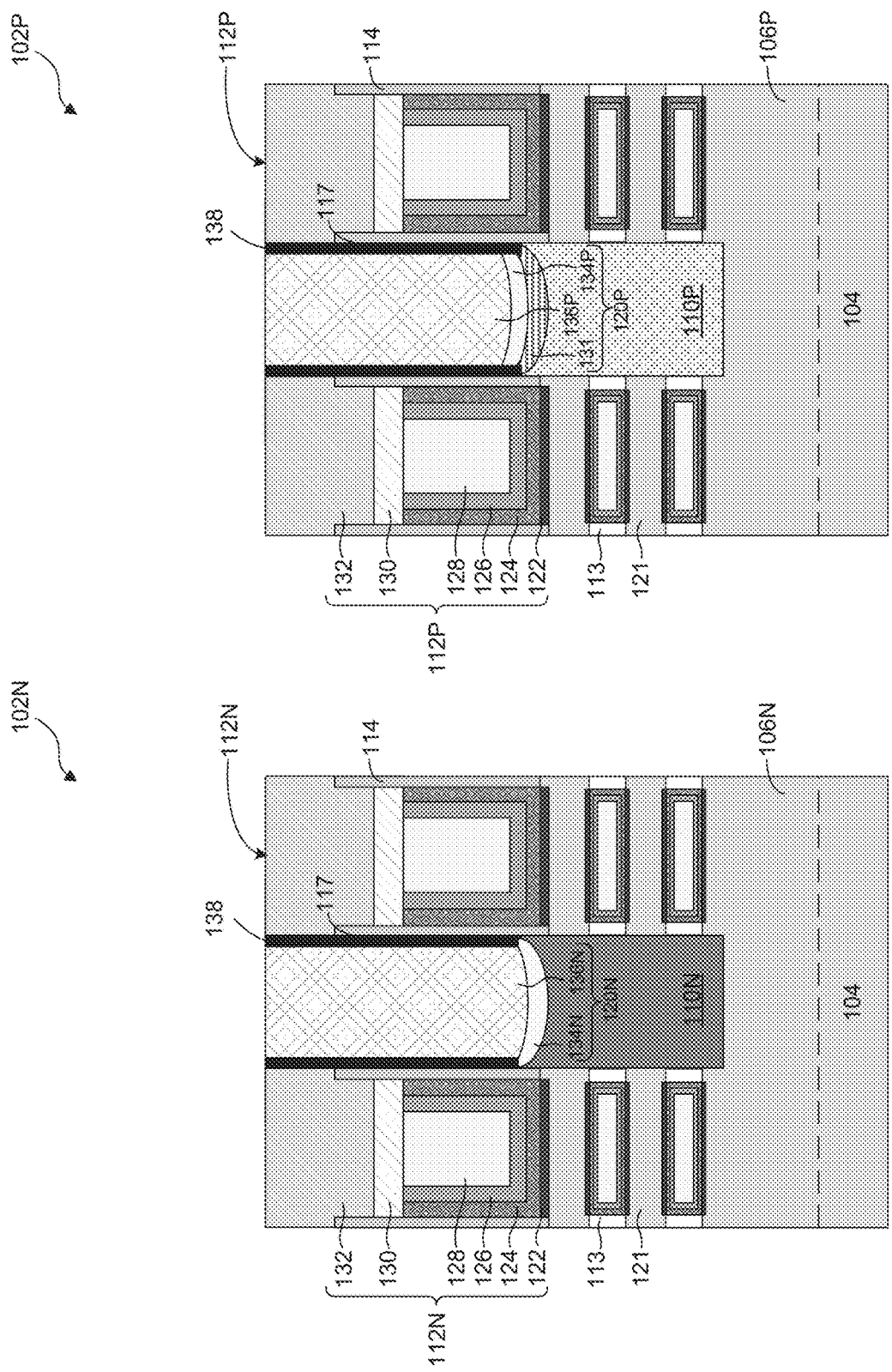
FIGS. 1B and 1C illustrate cross-sectional views of a semiconductor device with different contact structures, in accordance with some embodiments.

FIG. 1A illustrates an isometric view of a semiconductor device 100 with NFET 102N and PFET 102P, according to some embodiments. FIG. 1B illustrates a cross-sectional view of NFET 102N along line A-A of FIG. 1A. FIG. 1C illustrates a cross-sectional views of PFET 102P along line B-B of FIG. 1A. FIGS. 1B and 1C illustrate cross-sectional views of semiconductor device 100 with additional structures that are not shown in FIG. 1A for simplicity. The discussion of elements of NFET 102N and PFET 102P with the same annotations applies to each other, unless mentioned otherwise.

Referring to FIG. 1A, NFET 102N can include an array of gate structures 112N disposed on fin structure 106N, and PFET 102P can include an array of gate structures 112P disposed on fin structure 106P. NFET 102N can further include stacks of nanostructured channel regions 121 surrounded by gate structures 112N and an array of S/D regions 110N (one of S/D regions 110N visible in FIG. 1A) disposed on portions of fin structure 106N that are not covered by gate structures 112N. Similarly, PFET 102P can further include stacks of nanostructured channel regions 121 surrounded by gate structures 112P and an array of epitaxial S/D regions 110P (one of S/D regions 110P visible in FIG. 1A) disposed on portions of fin structure 106P that are not covered by gate structures 112P. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm.

Semiconductor device 100 can further include gate spacers 114, shallow trench isolation (STI) regions 116, etch stop layers (ESLs) 117, and interlayer dielectric (ILD) layers 118. ILD layer 118 can be disposed on ESL 117. ESL 117 can be configured to protect gate structures 112N and 112P and/or S/D regions 110N and 110P. In some embodiments, gate spacers 114, STI regions 116, ESLs 117, and ILD layers 118 can include an insulating material, such as silicon oxide, silicon nitride (SiN), silicon carbon nitride (SiCN), silicon oxycarbon nitride (SiOCN), and silicon germanium oxide.

Semiconductor device 100 can be formed on a substrate 104 with NFET 102N and PFET 102P formed on different regions of substrate 104. There may be other FETs and/or structures (e.g., isolation structures) formed between NFET 102N and PFET 102P on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structures 106N-106P can include a material similar to substrate 104 and extend along an X-axis.

Referring to FIGS. 1B-1C, NFET-PFET 102N-102P can include stacks of nanostructured channel regions 121, gate structures 112N-112P, S/D regions 110N-110P, and S/D contact structures 120N-120P disposed on S/D regions 110N-110P.

In some embodiments, nanostructured channel regions 121 can include semiconductor materials similar to or different from substrate 104. In some embodiments, nanostructured channel regions 121 can include Si, SiAs, silicon phosphide (SiP), SiC, SiCP, SiGe, Silicon Germanium Boron (SiGeB), Germanium Boron (GeB), Silicon-Germanium-Tin-Boron (SiGeSnB), a III-V semiconductor compound, or other suitable semiconductor materials. Though rectangular cross-sections of nanostructured channel regions 121 are shown, nanostructured channel regions 121 can have cross-sections of other geometric shapes (e.g., circular, elliptical, triangular, or polygonal).

In some embodiments, gate structures 112N-112P can be multi-layered structures and can surround each of nanostructured channel regions 121 for which gate structures 112N-112P can be referred to as "gate-all-around (GAA) structures" or "horizontal gate-all-around (HGAA) structures." NFET 102N can be referred to as "GAA FET 102N" or "GAA NFET 102N" and PFET 102N can be referred to as "GAA FET 102P" or "GAA PFET 102P." The portions of gate structures 112N-112P surrounding nanostructured channel regions 121 can be electrically isolated from adjacent S/D regions 110N-110P by inner spacers 113. Inner spacers 113 can include a material similar to gate spacers 114. In some embodiments, NFET-PFET 102N-102P can be finFETs and have fin regions (not shown) instead of nanostructured channel regions 121.

In some embodiments, each of gate structures 112N-112P can include an interfacial oxide (IO) layer 122, a high-k (HK) gate dielectric layer 124 disposed on IO layer 122, a work function metal (WFM) layer 126 disposed on HK gate dielectric layer 124, a gate metal fill layer 128 disposed on WFM layer 126, a conductive capping layer 130 disposed on HK gate dielectric layer 124, WFM layer 126, and gate metal fill layer 128, and an insulating capping layer 132 disposed on conductive capping layer 130.

IO layers 122 can include silicon oxide ($SiO_2$), silicon germanium oxide ($SiGeO_x$), or germanium oxide ($GeO_x$). HK gate dielectric layers 124 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). WFM layers 126 of gate structures 112N can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, a combination thereof, or other suitable Al-based materials. WFM layers 126 of gate structures 112P can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. Gate metal fill layers 128 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Insulating capping layer 132 protects the underlying conductive capping layer 130 from structural and/or compositional degradation during subsequent processing of the semiconductor device. In some embodiments, insulating capping layer 132 can include a nitride material, such as silicon nitride, and can have a thickness of about 5 nm to about 10 nm for adequate protection of the underlying conductive capping layer 130.

Conductive capping layers 130 provide conductive interfaces between gate metal fill layers 128 and gate contact structures (not shown) to electrically connect gate metal fill layers 128 to gate contact structures without forming gate contact structures directly on or within gate metal fill layers 128. Gate contact structures are not formed directly on or within gate metal fill layers 128 to prevent contamination by any of the processing materials used in the formation of gate contact structures. Contamination of gate metal fill layers 128 can lead to the degradation of device performance. Thus, with the use of conductive capping layers 130, gate structures 112N-112P can be electrically connected to gate contact structures without compromising the integrity of gate structures 112N-112P.

In some embodiments, conductive capping layer 130 can have a thickness of about 4 nm to about 5 nm for adequately providing a conductive interface between gate metal fill layer 128 and a gate contact structure without compromising the device size and manufacturing cost. In some embodiments, for adequate protection of the underlying conductive capping layer 130, a ratio between a thickness of conductive capping layer 130 and a thickness of insulating capping layer 132 can range from about 1:1 to about 1:2. In some embodiments, conductive capping layer 130 can include a metallic material, such as W, Ru, Ir, Mo, other suitable metallic materials, and a combination thereof. In some embodiments, conductive capping layer 130 can be formed using a precursor gas of tungsten pentachloride ($WCl_5$) or tungsten hexachloride ($WCl_6$), and as a result, conductive capping layer 130 can include tungsten with impurities of chlorine atoms. The concentration of chlorine atom impurities can range from about 1 atomic percent to about 10 atomic percent of the total concentration of atoms in each conductive capping layer 130.

Referring to FIG. 1B, S/D region 110N can include a stack of epitaxial layers—a lightly doped (LD) n-type layer (not shown) epitaxially grown on fin structure 106N and a heavily doped (HD) n-type layer (not shown) epitaxially grown on LD n-type layer. In some embodiments, LD and HD n-type layers can include epitaxially-grown semiconductor material, such as silicon, and n-type dopants, such as phosphorus and other suitable n-type dopants. LD n-type layers can include a doping concentration ranging from about $10^{15}$ atoms/cm$^3$ to about $10^{18}$ atoms/cm$^3$, which is lower than a doping concentration of HD n-type layers, which can range from about $10^{19}$ atoms/cm$^3$ to about $10^{23}$ atoms/cm$^3$. In some embodiments, HD n-type layer is thicker than LD n-type layer.

Referring to FIG. 1C, S/D region 110P can include a stack of epitaxial layers—a LD p-type layer (not shown) epitaxially grown on fin structure 106P and a HD p-type layer (not shown) epitaxially grown on LD p-type layer. In some embodiments, LD and HD p-type layers can include epitaxially-grown semiconductor material, such as SiGe, and p-type dopants, such as boron and other suitable p-type dopants. LD p-type layers can include a doping concentration ranging from about $10^{15}$ atoms/cm$^3$ to about $10^{18}$ atoms/cm$^3$, which is lower than a doping concentration of HD p-type layers, which can range from about $10^{19}$ atoms/cm$^3$ to about $10^{23}$ atoms/cm$^3$. In some embodiments, LD p-type layers can include a Ge concentration ranging from about 5 atomic percent to about 45 atomic percent, which is lower than a Ge concentration of HD p-type layers, which can range from about 50 atomic percent to about 80 atomic percent. In some embodiments, HD p-type layer is thicker than LD p-type layer.

Referring to FIG. 1B, S/D contact structure 120N is disposed on S/D region 110N. In some embodiments, S/D contact structure 120N can include (i) an nWFM silicide layer 134N (also referred to as "nWFM silicide-germanide layer 134N") disposed on S/D region 110N, and (ii) a contact plug 136N disposed on nWFM silicide layer 134N. In some embodiments, nWFM silicide layer 134N can include a metal or a metal silicide-germanide with a work function value closer to a conduction band-edge energy than a valence band-edge energy of the material of S/D region 110N. For example, the metal or the metal silicide-germanide can have a work function value less than 4.5 eV (e.g., about 3.5 eV to about 4.4 eV), which can be closer to the conduction band energy (e.g., 4.1 eV of Si or 3.8 eV of SiGe) than the valence band energy (e.g., 5.2 eV of Si or 4.8 eV of SiGe) of Si-based or SiGe-based material of S/D region 110N. In some embodiments, the metal silicide-germanide of nWFM silicide layer 134N can include titanium silicide-germanide ($Ti_xSi_yGe_z$), tantalum silicide-germanide ($Ta_xSi_yGe_z$), molybdenum silicide-germanide ($Mo_xSi_yGe_z$), zirconium silicide-germanide ($Zr_xSi_yGe_z$), hafnium silicide-germanide ($Hf_xSi_yGe_z$), scandium silicide-germanide ($Sc_xSi_yGe_z$), yttrium silicide-germanide ($Y_xSi_yGe_z$), terbium silicide-germanide ($Tb_xSi_yGe_z$), lutetium silicide-germanide ($Lu_xSi_yGe_z$), erbium silicide-germanide ($Er_xSi_yGe_z$), ybtterbium silicide-germanide ($Yb_xSi_yGe_z$), europium silicide-germanide ($Eu_xSi_yGe_z$), thorium silicide-germanide ($Th_xSi_yGe_z$), or a combination thereof.

In some embodiments, contact plug 136N can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), tin (Sn), silver (Ag), gold (Au), zinc (Zn), cadmium (Cd), and a combination thereof.

Referring to FIG. 1C, S/D contact structure 120P is disposed on S/D region 110P. In some embodiments, S/D contact structure 120P can include (i) a pWFM silicide layer 131 (also referred to as "pWFM silicide-germanide layer 131") disposed on S/D region 110P, (ii) an nWFM silicide layer 134P (also referred to as "nWFM silicide-germanide layer 134P") disposed on pWFM silicide layer 131, and (iii) a contact plug 136P disposed on nWFM silicide layer 134P. The height of contact plug 136N along a Z-axis is greater than the height of contact plug 136P along a Z-axis by about a thickness of nWFM silicide layer 134P along a Z-axis. The discussion of contact plug 136N applies to contact plug 136P, unless mentioned otherwise.

In some embodiments, pWFM silicide layer 131 can include a metal or a metal silicide-germanide with a work function value closer to a valence band-edge energy than a conduction band-edge energy of the material of S/D region 110P. For example, the metal or the metal silicide-germanide can have a work function value greater than 4.5 eV (e.g., about 4.5 eV to about 5.5 eV), which can be closer to the valence band energy (e.g., 5.2 eV of Si or 4.8 eV of SiGe) than the conduction band energy (e.g., 4.1 eV of Si or 3.8 eV of SiGe) of Si-based or SiGe-based material of S/D region 110P. In some embodiments, the metal silicide-germanide of pWFM silicide layer 131 can include nickel silicide-germanide ($Ni_xSi_yGe_z$), cobalt silicide-germanide ($Co_xSi_yGe_z$), manganese silicide-germanide ($Mn_xSi_yGe_z$), tungsten silicide-germanide ($W_xSi_yGe_z$), iron silicide-germanide ($Fe_xSi_yGe_z$), rhodium silicide-germanide ($Rh_xSi_yGe_z$), palladium silicide-germanide ($Pd_xSi_yGe_z$), ruthenium silicide-germanide ($Ru_xSi_yGe_z$), platinum silicide-germanide ($Pt_xSi_yGe_z$), iridium silicide-germanide ($Ir_xSi_yGe_z$), osmium silicide-germanide ($Os_xSi_yGe_z$), or a combination thereof. The metal silicide-germanide of pWFM silicide layer 131 is different from the metal silicide-germanide of nWFM silicide layers 134N-134P and can have a work function value greater than the work function values of nWFM silicide layers 134N-134P. In some embodiments, nWFM silicide layer 134P can be formed at the same time as nWFM silicide layer 134N and can include a metal silicide-germanide similar to nWFM silicide layer 134N.

Figure 2:
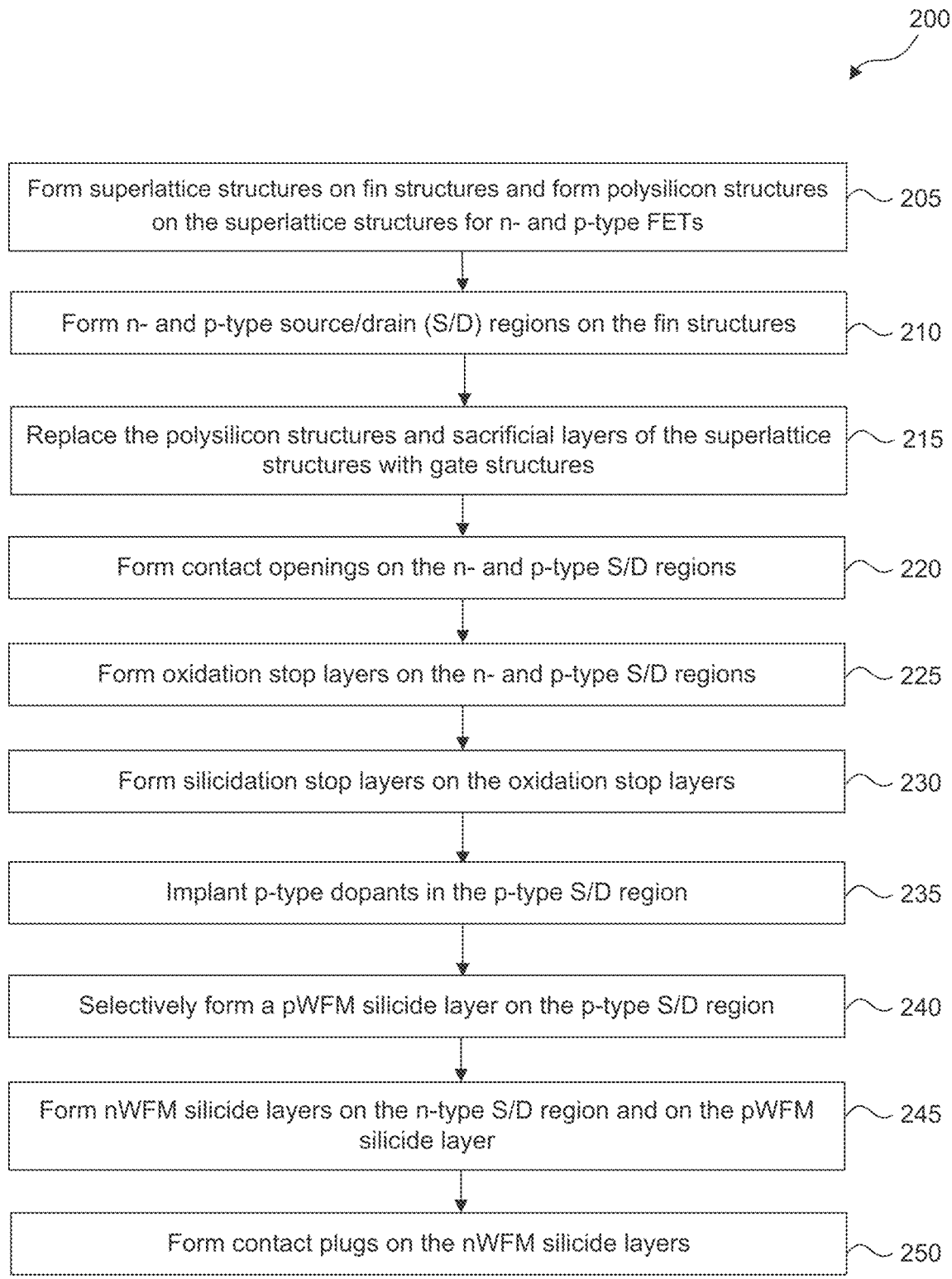
FIG. 2 is a flow diagram of a method for fabricating a semiconductor device with different contact structures, in accordance with some embodiments.

FIG. 2 is a flow diagram of an example method 200 for fabricating NFET 102N and PFET 102P of semiconductor device 100, according to some embodiments. For illustrative purposes, the operations illustrated in FIG. 2 will be described with reference to the example fabrication process for fabricating NFET 102N and PFET 102P as illustrated in FIGS. 3A-8B, 8C, 9A-9C, and 10A-16B. FIGS. 3A-16A are cross-sectional views of NFET 102N along line A-A of FIG. 1A, and FIGS. 3B-16B are cross-sectional views of PFET 102P along line B-B of FIG. 1A at various stages of fabrication, according to some embodiments. Operations can be performed in a different order or not performed depending on specific applications. It should be noted that method 200 may not produce a complete NFET 102N and PFET 102P. Accordingly, it is understood that additional processes can be provided before, during, and after method 200, and that some other processes may only be briefly described herein. Elements in FIGS. 3A-8B, 8C-8D, 9A-9D, and 10A-16B with the same annotations as elements in FIGS. 1A-1C are described above.

Figures 3A, 3B:
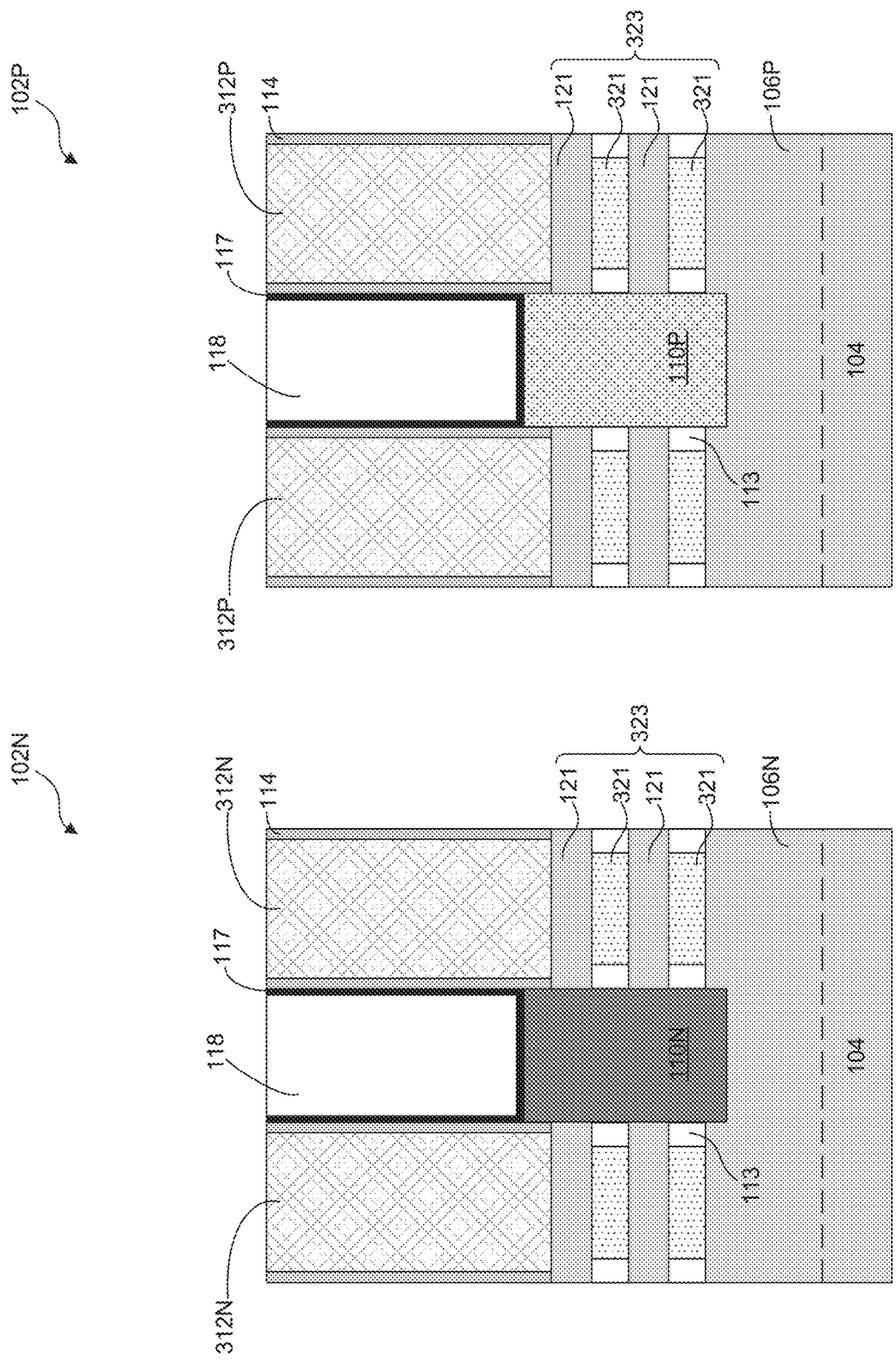

Referring to FIG. 2, in operation 205, superlattice structures are formed on fin structures, and polysilicon structures are formed on the superlattice structures for NFET and PFET. For example, as shown in FIGS. 3A-3B, superlattice structures 323 are formed on fin structures 106N-106P, and polysilicon structures 312N-312P are formed on superlattice structures 323. Superlattice structures 323 can include nanostructured layers 121 and 321 arranged in an alternating configuration. In some embodiments, nanostructured layers 121 and 321 include materials different from each other. Nanostructured layers 321 are also referred to as sacrificial layers 321. During subsequent processing, polysilicon structures 312N-312P and sacrificial layers 321 can be replaced in a gate replacement process to form gate structures 112N-112P.

Referring to FIG. 2, in operation 210, n- and p-type S/D regions are formed on the fin structures. For example as shown in FIGS. 3A-3B, S/D regions 110N-110P are formed on fin structures 106N-106P. In some embodiments, S/D regions 110N-110P can be epitaxially grown on fin structures 106N-106P. Prior to the formation of S/D regions 110N-110P, inner spacers 113 can be formed in superlattice structures 323, as shown in FIGS. 3A-3B. After the formation of S/D regions 110N-110P, ESL 117 and ILD layer 118 can be formed, as shown in FIGS. 3A-3B.

Referring to FIG. 2, in operation 215, the polysilicon structures and sacrificial layers are replaced with gate structures. For example, as described with reference to FIGS. 4A-6B, polysilicon structures 312N-312P and sacrificial layers 321 are replaced with gate structures 112N-112P. The formation of gate structures 112N-112P can include sequential operations of (i) removing polysilicon structures 312N-312P and sacrificial layers 321 from the structures of FIGS. 3A-3B to form gate openings (not shown), (ii) forming IO oxide layers 122 within the gate openings, as shown in FIGS. 4A-4B, (iii) forming HK gate dielectric layers 124 on IO oxide layers 122, as shown in FIGS. 4A-4B, (iv) forming WFM layers 126 on HK gate dielectric layers 124, as shown in FIGS. 4A-4B, (v) forming gate metal fill layers 128 on WFM layers 126, as shown in FIGS. 4A-4B, (vi) etching gate spacers 114, HK gate dielectric layers 124, WFM layers 126, and gate metal fill layers, as shown in FIGS. 5A-5B, (vii) forming conductive capping layers 130 on HK gate dielectric layers 124, WFM layers 126, and gate metal fill layers, as shown in FIGS. 6A-6B, and (viii) forming insulating capping layers 132 on conductive capping layers 130, as shown in FIGS. 6A-6B.

Referring to FIG. 2, in operation 220, contact openings are formed on the n- and p-type S/D regions. For example, as shown in FIGS. 7A-7B, contact openings 740 are formed on S/D regions 110N-110P by removing portions of ESL 117 and ILD layer 118. After the formation of contact openings 740, diffusion barrier layers 138 can be formed along sidewalls of contact openings 740, as shown in FIGS. 7A-7B. In some embodiments, diffusion barrier layers 138 can include a dielectric nitride, such as silicon nitride ($Si_xN_y$), silicon oxynitride (SiON), silicon carbon nitride (SiCN), and other suitable dielectric nitride materials. Diffusion barrier layers 138 can prevent the oxidation of subsequently-formed contact plugs 136N-136P by preventing the diffusion of oxygen atoms from adjacent structures to contact plugs 136N-136P.

Referring to FIG. 2, in operation 225, oxidation stop layers are formed on the n- and p-type S/D regions. For example, as shown in FIGS. 8A-8B, oxidation stop layers 842 are formed on S/D regions 110N-110P. In some embodiments, oxidation stop layers 842 can be formed by epitaxially growing a semiconductor material on S/D regions 110N-110P. The semiconductor material of oxidation stop layers 842 can prevent underlying S/D regions 110N-110P from oxidizing during an oxidation process performed on subsequently-formed semiconductor layers 844, as described below. In some embodiments, the semiconductor material of oxidation stop layers 842 can be substantially resistant to oxidation at the temperature used for oxidizing subsequently-formed semiconductor layers 844. In some embodiments, the semiconductor material of oxidation stop layers 842 can include silicon, or other suitable semiconductor material. In some embodiments, oxidation stop layers 842 can have a thickness of about 1 nm to about 3 nm along a Z-axis. If the thickness of oxidation stop layers 842 is less than 1 nm, oxidation stop layers 842 may not adequately prevent the oxidation of S/D regions 110N-110P. On the other hand, if the thickness of oxidation stop layers 842 is greater than 3 nm, the processing time for removing oxidation stop layers 842 increases, and consequently increases device manufacturing cost.

Referring to FIG. 2, in operation 230, silicidation stop layers are formed on the oxidation stop layers. For example, as described with reference to FIGS. 8A-9D, silicidation stop layers 944 are formed on oxidation stop layers 842. In some embodiments, the formation of silicidation stop layers 944 can include sequential operations of (i) epitaxially growing semiconductor layers 844 on oxidation stop layers 842, as shown in FIGS. 8A-8B, and (ii) performing a thermal oxidation process at an oxidation temperature of 100° C. to about 400° C. on the structures of FIGS. 8A-8B to form the structures of FIGS. 9A-9B. The semiconductor material of oxidation stop layers 842 do not substantially oxidize (e.g., concentration of oxygen atoms in oxidation stop layers 842 equal to about zero or about 0.01 atomic % to about 2 atomic % after the thermal oxidation process) at the oxidation temperature of 100° C. to about 400° C. As a result, oxidation stop layers 842 do not substantially oxidize and prevent the oxidation of S/D regions 110N-110P during the thermal oxidation process.

In some embodiments, semiconductor layers 844 can include a semiconductor material that can form stronger chemical bonds with oxygen than with pWFM, such as nickel, cobalt, manganese, tungsten, iron, rhodium, palladium, ruthenium, platinum, iridium, and osmium. As a result, silicidation stop layers 944 (FIGS. 9A-9B) formed by oxidizing semiconductor layers 844 (FIGS. 8A-8B) do not substantially react with subsequently-deposited pWFM layer 1231 to form pWFM silicides (e.g., pWFM silicide layer 131), as described below.

In some embodiments, semiconductor layers 844 can include SiGe or other suitable semiconductor material, and silicidation stop layers 944 can include an oxide of SiGe (e.g., $SiGeO_x$) or other suitable semiconductor material. In some embodiments. $SiGeO_x$ has a stronger bond with oxygen than with pWFM, and consequently does not break the chemical bonds with oxygen to substantially react with subsequently-deposited pWFM layer 1231 to form pWFM silicides (e.g., concentration of silicon atoms in silicidation stop layers 944 equal to about zero or about 0.01 atomic % to about 2 atomic %) in S/D regions 110N in operation 240, as described below.

In some embodiments, Ge acts as an oxidation catalyst for oxidizing SiGe in semiconductor layers 844. In some embodiments, semiconductor layers 844 can have a Ge concentration of about 25 atomic % to about 55 atomic %. If Ge concentration is below 25 atomic %, SiGe in semiconductor layers 844 may not adequately oxidize during the thermal oxidation process. On the other hand, if Ge concentration is above 55 atomic %, the complexity and processing time for epitaxially growing SiGe for semiconductor layers 844 increases, and consequently increases device manufacturing cost.

In some embodiments, semiconductor layers 844 can have a thickness of about 2 nm to about 5 nm along a Z-axis and can be thicker than oxidation stop layers 842. If the thickness of semiconductor layers 844 is less than 2 nm, silicidation stop layers 944 formed after the oxidation of semiconductor layers 844 may not be thick enough to prevent the formation of pWFM silicides in S/D regions 110N. On the other hand, if the thickness of semiconductor layers 844 is greater than 5 nm, the duration of the thermal oxidation process increases, and consequently increases device manufacturing cost.

In some embodiments, silicidation stop layers 944 can have a thickness of about 10 nm to about 30 nm along a Z-axis and can be thicker than oxidation stop layers 842. If the thickness of silicidation stop layers 944 is less than 10 nm, silicidation stop layers 944 may not adequately prevent the formation of pWFM silicides in S/D regions 110N. On the other hand, if the thickness of silicidation stop layers 944 is greater than 30 nm, the processing time for removing silicidation stop layers 944 increases, and consequently increases device manufacturing cost.

Figure 8C:
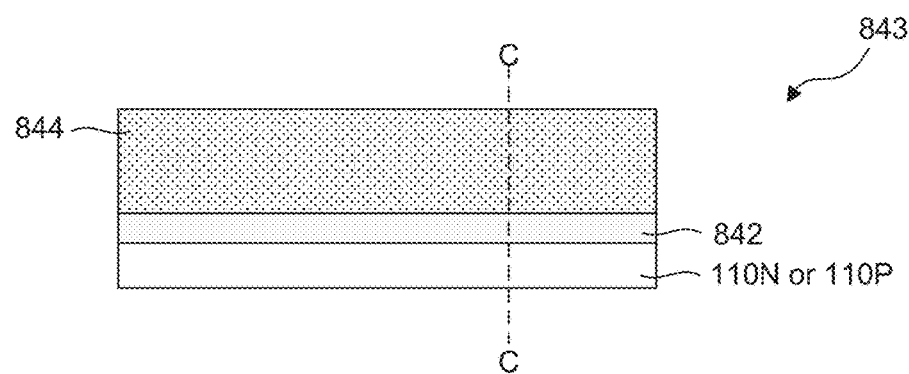
Figure 8D:
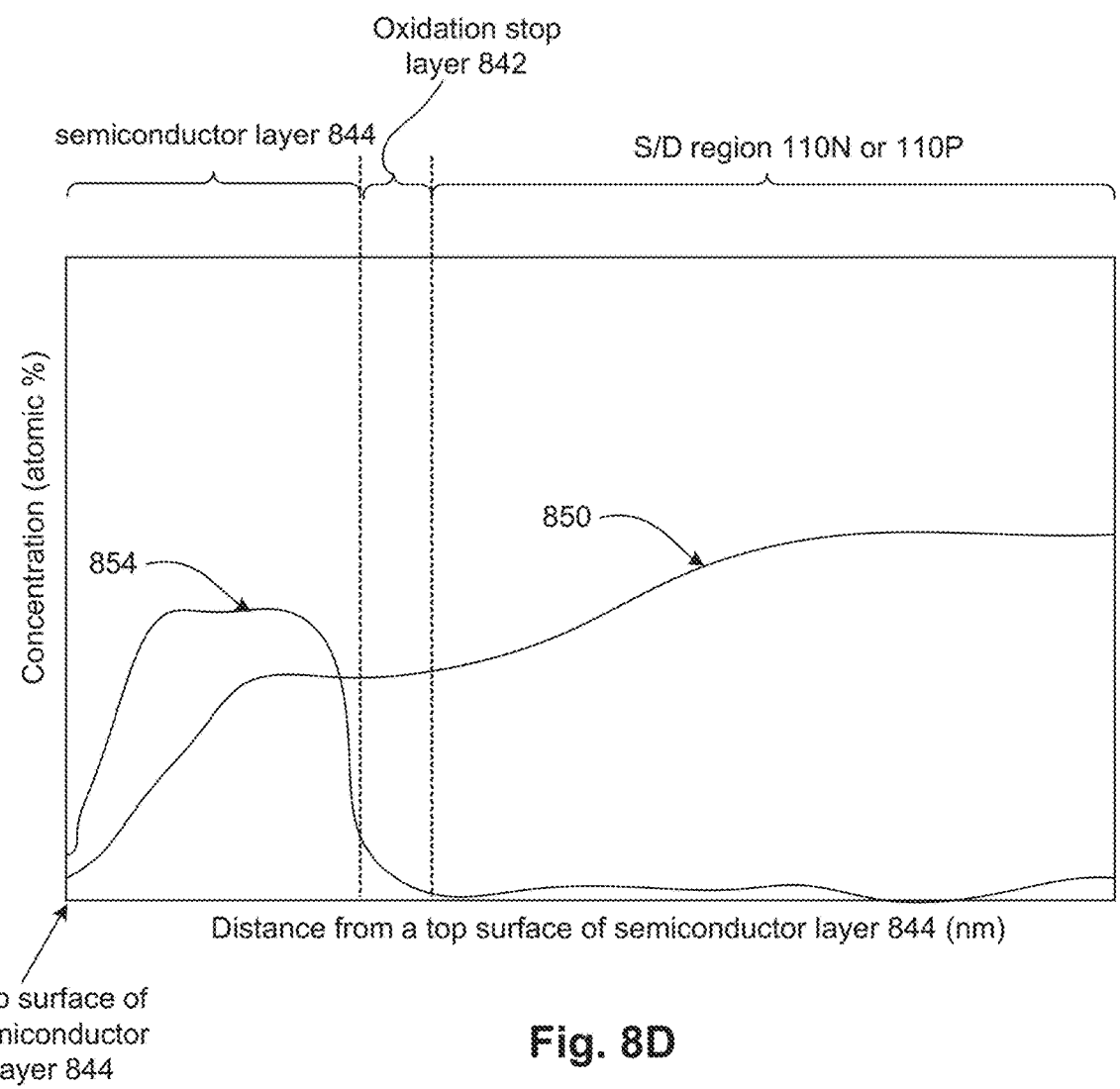
FIGS. 8D and 9D illustrate device characteristics of a semiconductor device at various stages of its fabrication process, in accordance with some embodiments.
Figure 9C:
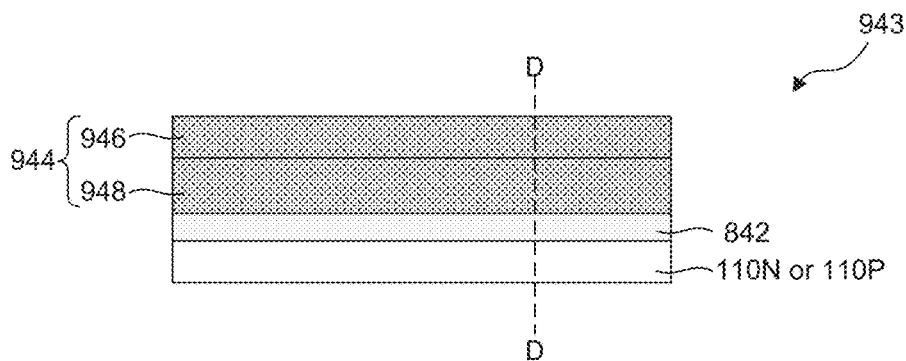

FIG. 8C shows an enlarged view of a portion 843 of the structures of FIGS. 8A-8B prior to performing the thermal oxidation process on semiconductor layers 844 having SiGe. FIG. 8D shows a Si concentration profile 850 and a Ge concentration profile 854 across line C-C of FIG. 8C. FIG. 9C shows an enlarged view of a portion 943 of the structures of FIG. 9A-9B after performing the thermal oxidation process on semiconductor layers 844 having SiGe to form silicidation stop layers 944. Due to preferential oxidation of Si over Ge, the Ge atoms in semiconductor layers 844 are pushed into the bottom portion of semiconductor layers 844 during the thermal oxidation process. As a result, in some embodiments, silicidation stop layers 944 can be formed with a top layer 946 of silicon oxide (SiOx) and a bottom layer of 948 SiGeOx (as shown in FIG. 9C) after the oxidation of semiconductor layers 844 having SiGe.

Figure 9D:
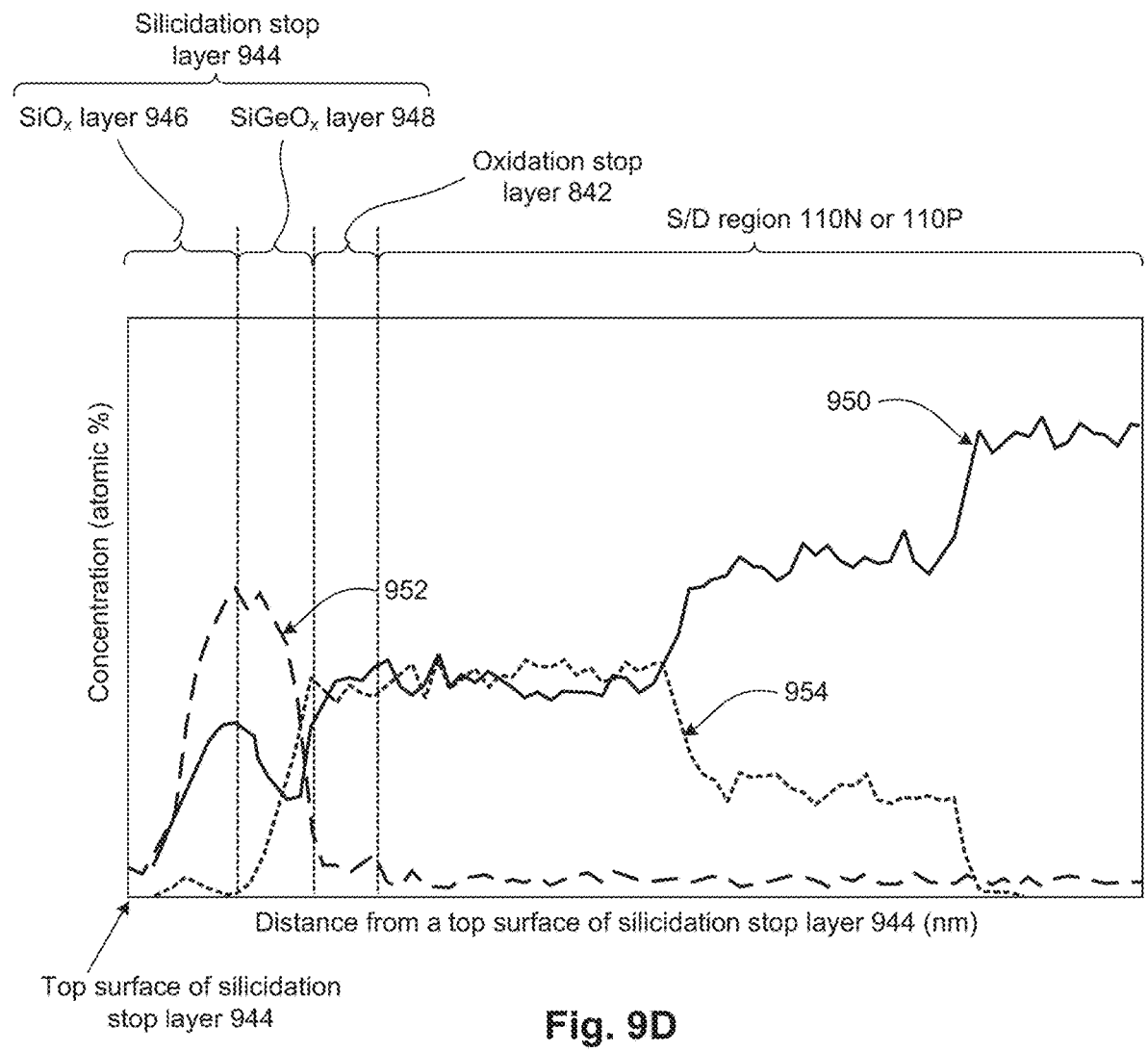

In some embodiments, the Ge atoms in semiconductor layers 844 are also pushed into oxidation stop layers 842 and top portions of S/D regions 110N-110P, as shown in FIG. 9D. FIG. 9D shows a Si concentration profile 950, and oxygen concentration profile 952, and a Ge concentration profile 954 across line D-D of FIG. 9C. The migration of Ge atoms during the oxidation of semiconductor layers 844 having SiGe can be observed by comparing Ge concentration profiles 854 and 954 of FIGS. 8D and 9D. FIG. 8D shows that semiconductor layers 844 has higher Ge concentration than oxidation stop layers 842 and S/D regions 110N-110P prior to the thermal oxidation process. FIG. 9D shows that the Ge concentration reduced in semiconductor layers 844 and increased in oxidation stop layers 842 and S/D regions 110N-110P after the thermal oxidation process.

Figures 10A, 10B:
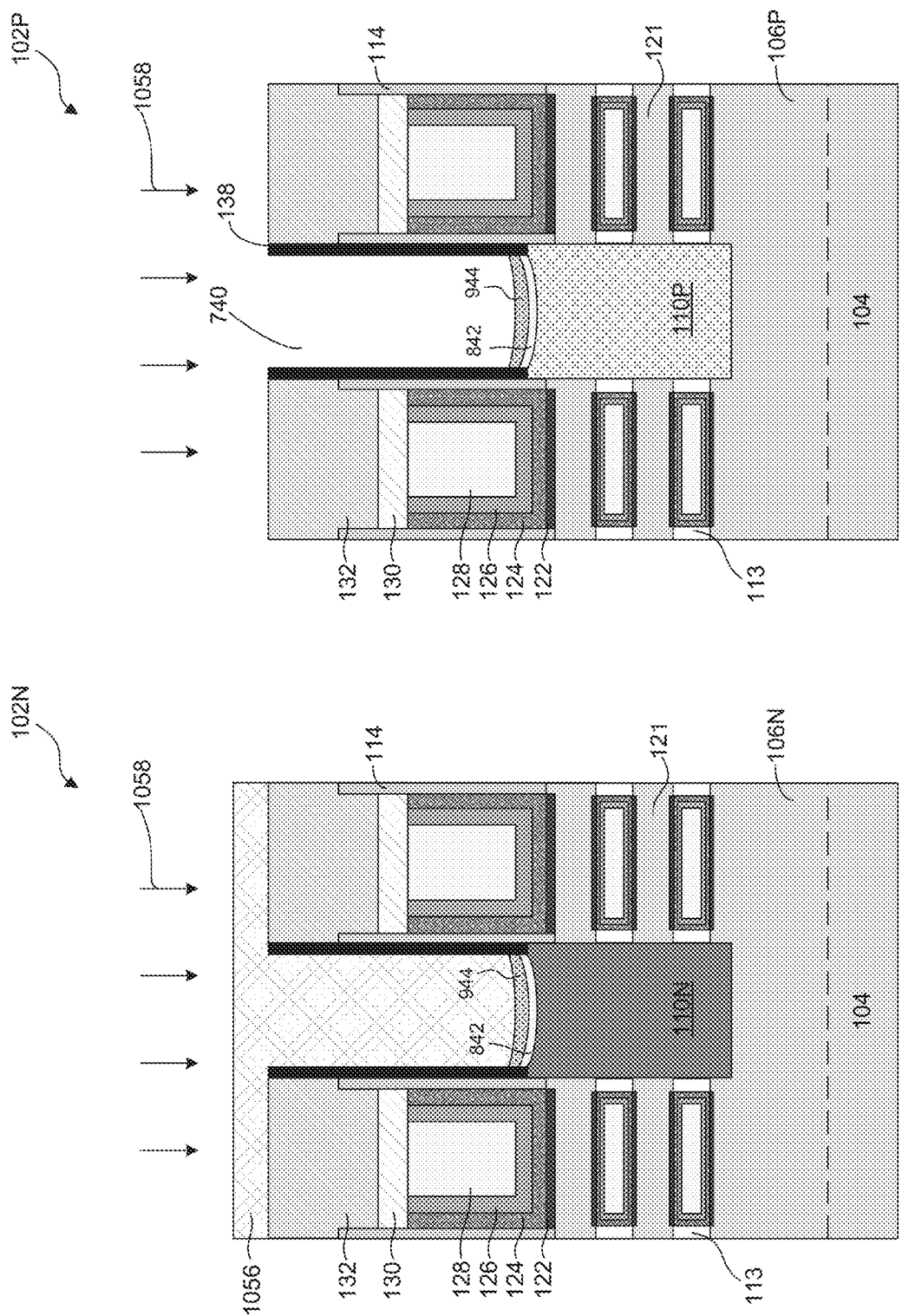
Figures 11A, 11B:
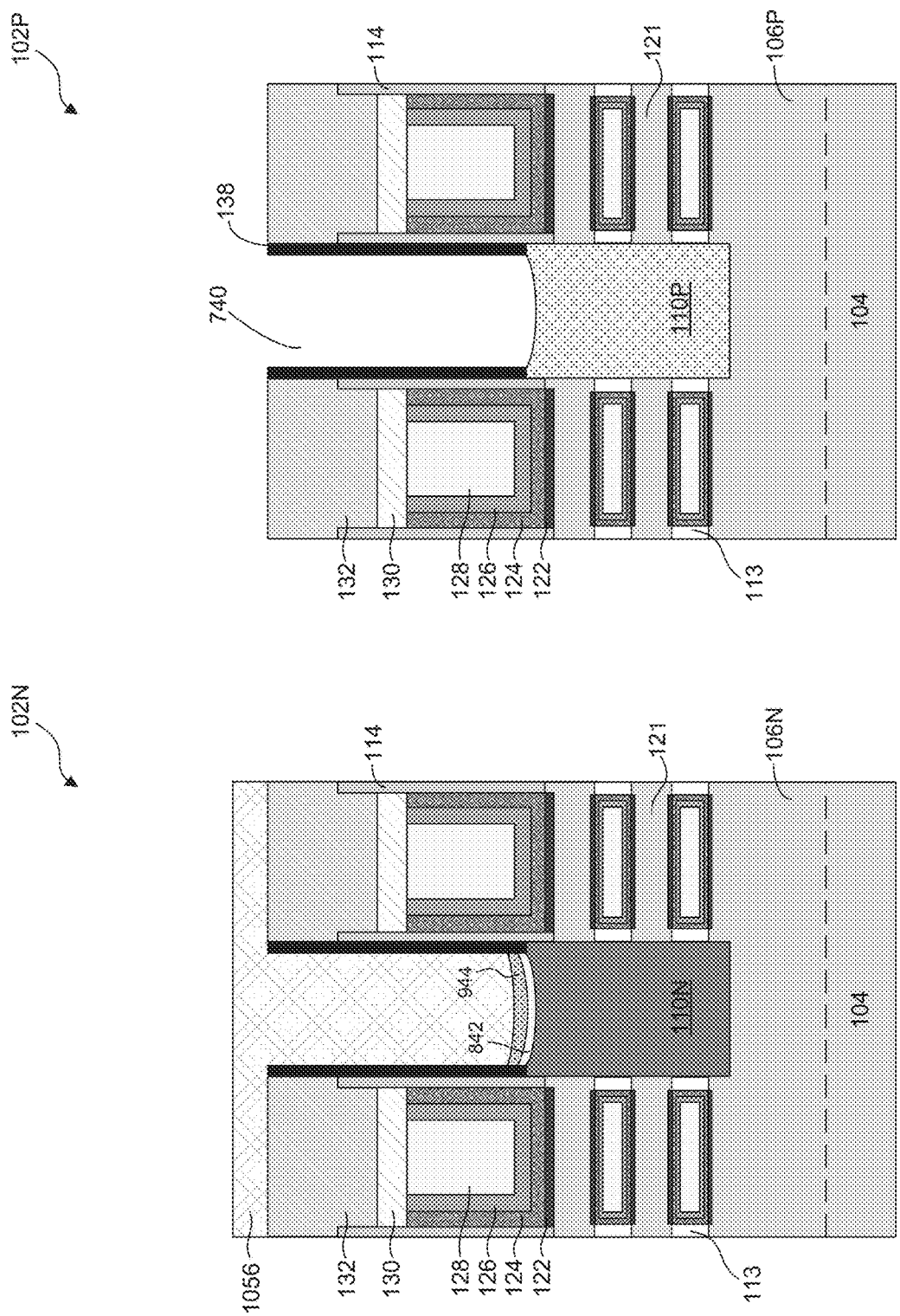
Figures 12A, 12B:
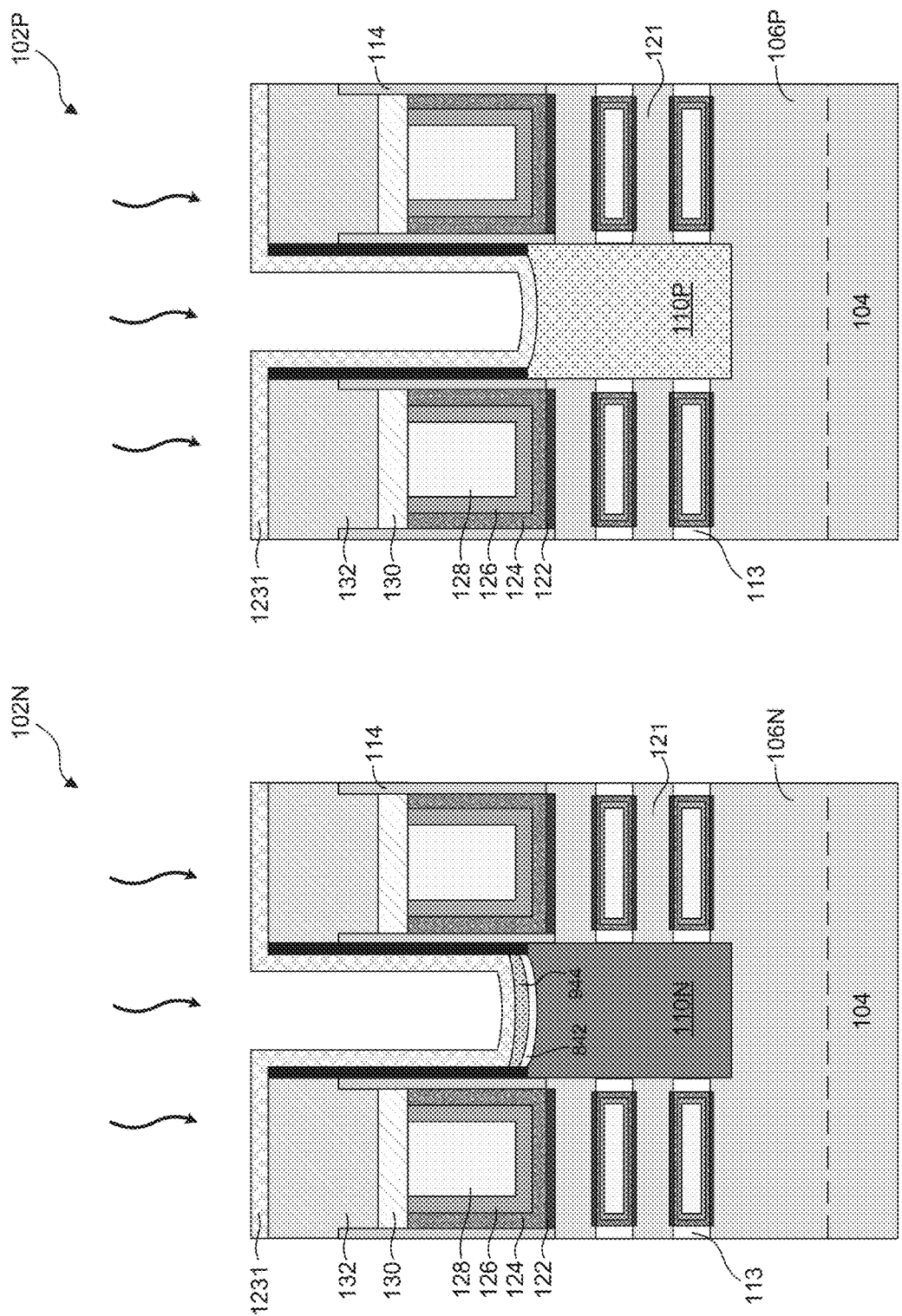

Referring to FIG. 2, in operation 235, p-type dopants are implanted in the p-type S/D region. For example, as shown in FIGS. 10A-10B, p-type dopants 1058, such as boron are implanted in S/D region 110P. The p-type dopant implantation process can include sequential operations of (i) forming a masking layer 1056 on NFET 102N, as shown in FIG. 10A, and (ii) performing an ion implantation with p-type dopants 1058 on the structures of FIGS. 10A-10B. In some embodiments, a p-type dopant concentration of about $10^{20}$ atoms/cm$^3$ to about $10^{21}$ atoms/cm$^3$ can be implanted in S/D region 110P.

Figures 13A, 13B:
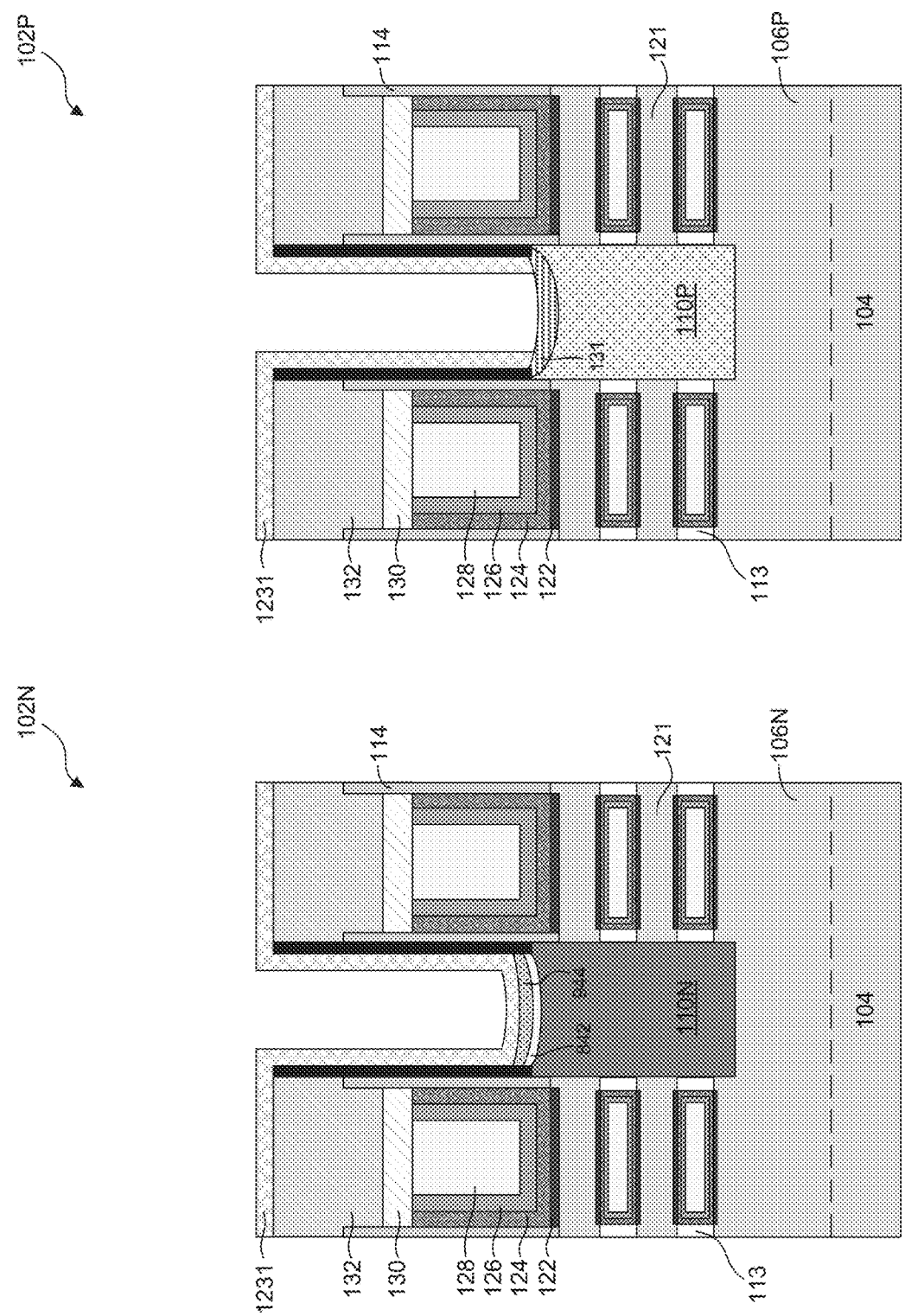
Figures 15A, 15B:
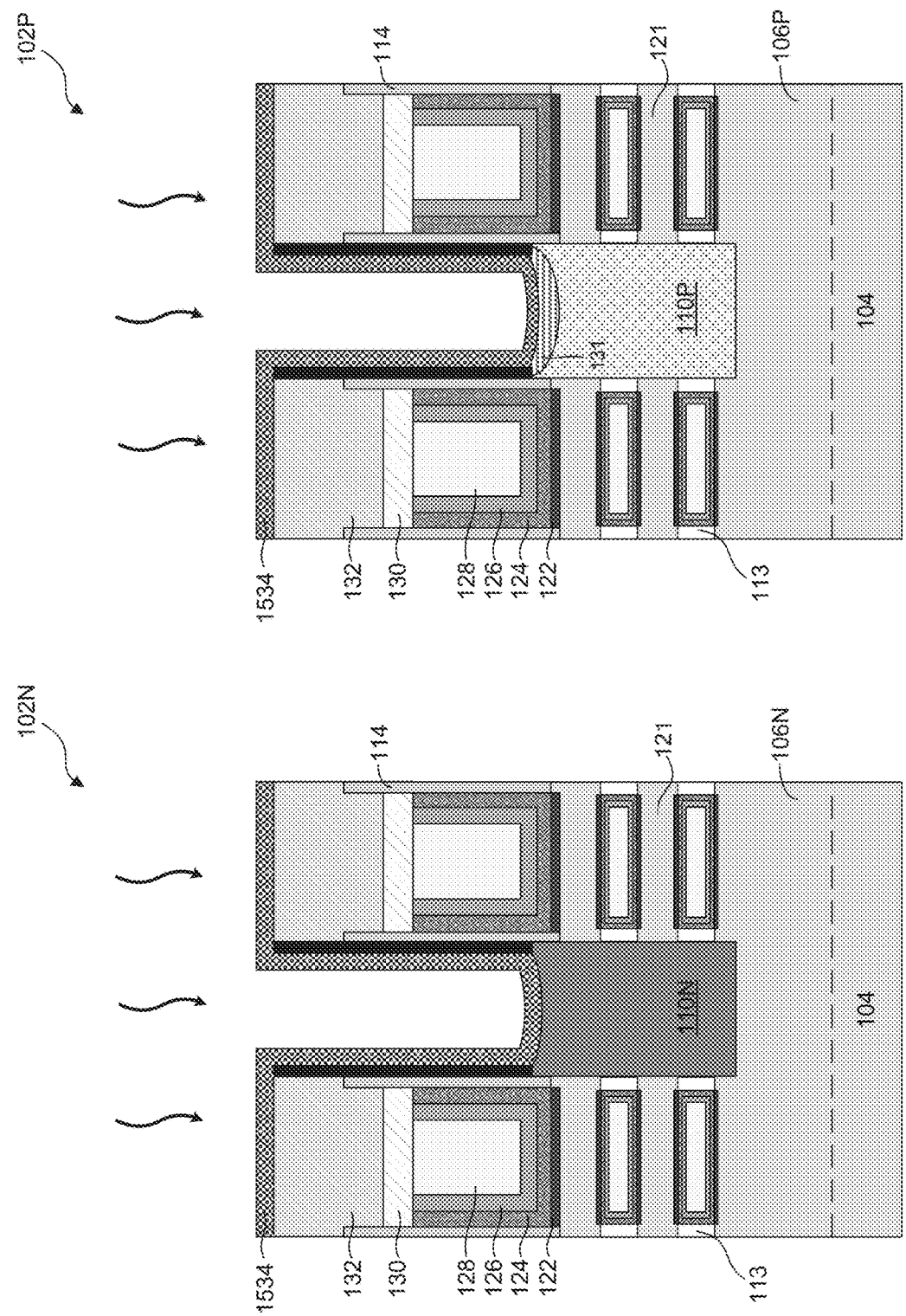

Referring to FIG. 2, in operation 240, a pWFM silicide layer is selectively formed on the p-type S/D region. For example, as described with reference to FIGS. 11A-14B, pWFM silicide layer 131 is selectively formed on S/D region 110P. The selective formation of pWFM silicide layer 131 can include sequential operations of (i) performing an etch process (e.g., etching with dilute hydrofluoric acid) on the structures of FIGS. 10A-10B to remove oxidation stop layer 842 and silicidation stop layer 944 from the structure of FIG. 10B, as shown in FIG. 111B, (ii) depositing a pWFM layer 1231 on the structures of FIGS. 11A-11B after removing masking layer 1056 from the structure of FIG. 11A to form the structures of FIGS. 12A-12B, and (iii) performing an anneal process at a temperature of about 400° C. to about 500° C. on the structures of FIGS. 12A-12B to initiate a silicidation reaction between S/D region 110P and the bottom portion of pWFM layer 1231 to form pWFM silicide layer 131, as shown in FIG. 13B.

In some embodiments, pWFM layer 1231 can include a work function value closer to a valence band-edge energy than a conduction band-edge energy of the material of S/D region 110P. For example, pWFM layer 1231 can include a metal with a work function value greater than 4.5 eV (e.g., about 4.5 eV to about 5.5 eV), which can be closer to the valence band energy 5.2 eV of Si or 4.8 eV of SiGe than the conduction band energy 4.1 eV of Si or 3.8 eV of SiGe of S/D region 110P. In some embodiments, pWFM layer 1231 can include Ni, Co, Mn, W, Fe, Rh, Pd, Ru, Pt, Ir, Os, or a combination thereof. In some embodiments, the metal of pWFM layer 1231 reacts with Si atoms in S/D region 110P and Ge atoms that were pushed into S/D region 110P during the thermal oxidation process in operation 230. As a result, in some embodiments, pWFM silicide layer 131 can include a metal silicide-germanide (an alloy of metal silicide and metal germanide).

The deposition of pWFM layer 1231 can include depositing about 0.5 nm to about 5 nm thick pWFM layer with a chemical vapor deposition (CVD) process or an atomic layer deposition (ALD) process at a temperature ranging from about 160° C. to about 220° C. and a pressure ranging from about 5 Torr to about 10 Torr. In some embodiments, the ALD process can include about 10 to few hundred cycles, where one cycle can include sequential periods of (i) metal precursor, reactant, and carrier gas mixture flow and (ii) a gas purging process for a period of about 3 seconds to about 15 seconds. In some embodiments, the reactant gas can include ammonia (NH$_3$), carrier gas can include nitrogen or argon, and purging gas can include a noble gas.

The portion of pWFM layer 1231 on S/D region 110N does not react with silicidation stop layer 944 and/or the material of S/D region 110N to form a metal silicide as silicidation stop layer 944 on S/D region 110N prevents pWFM layer 1231 from reacting with silicidation stop layer 944 and/or the material of S/D region 110N. The silicon-oxygen (Si—O) bonds of silicidation stop layer 944 do not break at the silicidation temperature of about 400° C. to about 500° C., and as a result, the silicon atoms of silicidation stop layer 944 do not react with the metal of pWFM layer 1231 to form a metal silicide.

In some embodiments, after the formation of pWFM silicide layer 131, the unreacted portions of pWFM layer 1231, oxidation stop layer 842, and silicidation stop layer 944 can be removed by a wet etching process to form the structures of FIGS. 14A-14B.

Referring to FIG. 2, in operation 245, nWFM silicide layers are formed on the n-type S/D region and on the pWFM silicide layer. For example, as described with reference to FIGS. 15A-16B, nWFM silicide layers 134N and 134P are formed on S/D region 110N and on pWFM silicide layer 131, respectively. The formation of nWFM silicide layers 134N-134P can include sequential operations of (i) depositing an n WFM layer 1534 on the structures of FIGS. 14A-14B, and (ii) performing an anneal process at a temperature of about 400° C. to about 500° con the structures of FIGS. 15A-15B. The anneal process can initiate silicidation reactions between (i) S/D region 110N and the bottom portion of nWFM layer 1534 to form nWFM silicide layer 134N, as shown in FIG. 16A, and (ii) the bottom portion of nWFM layer 1534 and S/D region 110P through pWFM silicide layer 131 to form nWFM silicide layer 134P, as shown in FIG. 16B.

In some embodiments, the deposition of nWFM layer 1534 can include depositing a metal with a work function value closer to a conduction band-edge energy than a valence band-edge energy of the material of S/D region 110N using a CVD process or an ALD process at a temperature ranging from about 300° C. to about 500° C. For example, nWFM layer 1534 can include a metal with a work function value less than 4.5 eV (e.g., about 3.5 eV to about 4.4 eV), which can be closer to the conduction band energy 4.1 eV of Si or 3.8 eV of SiGe than the valence band energy 5.2 eV of Si or 4.8 eV of SiGe of S/D region 110N. In some embodiments, nWFM layer 1534 can include Ti, Ta, Mo, Zr, Hf, Sc, Y, Ho, Tb, Gd, Lu, Dy, Er, Yb, or a combination thereof. In some embodiments, the metal of nWFM layer 1534 reacts with Si atoms in S/D region 110N and Ge atoms that were pushed into S/D region 110N during the thermal oxidation process in operation 230. As a result, in some embodiments, nWFM silicide layer 134N can include a metal silicide-germanide (an alloy of metal silicide and metal germanide).

Figure 16B:
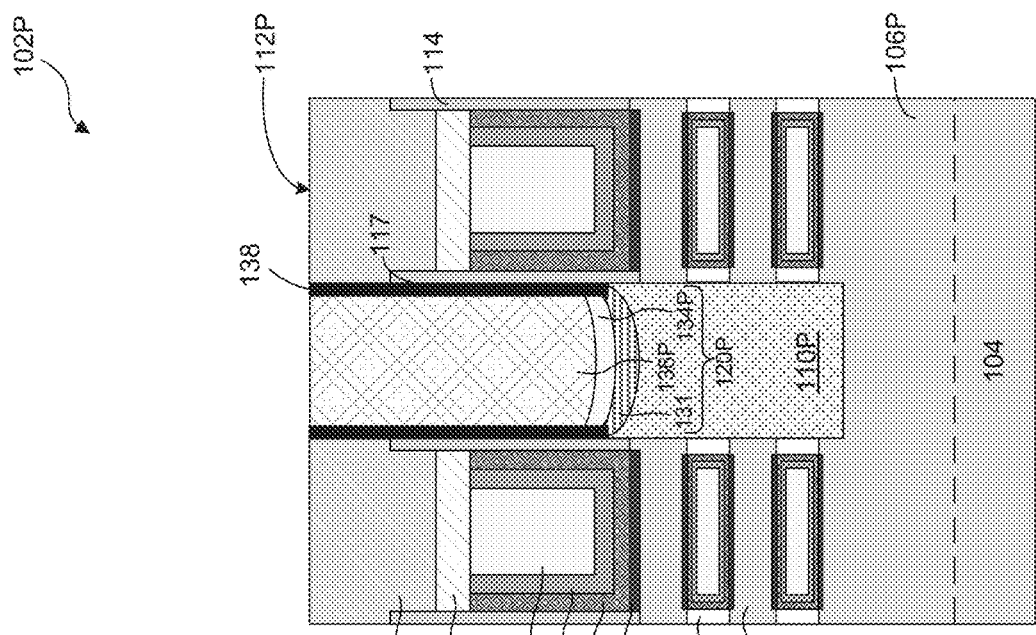
Figure 16A:
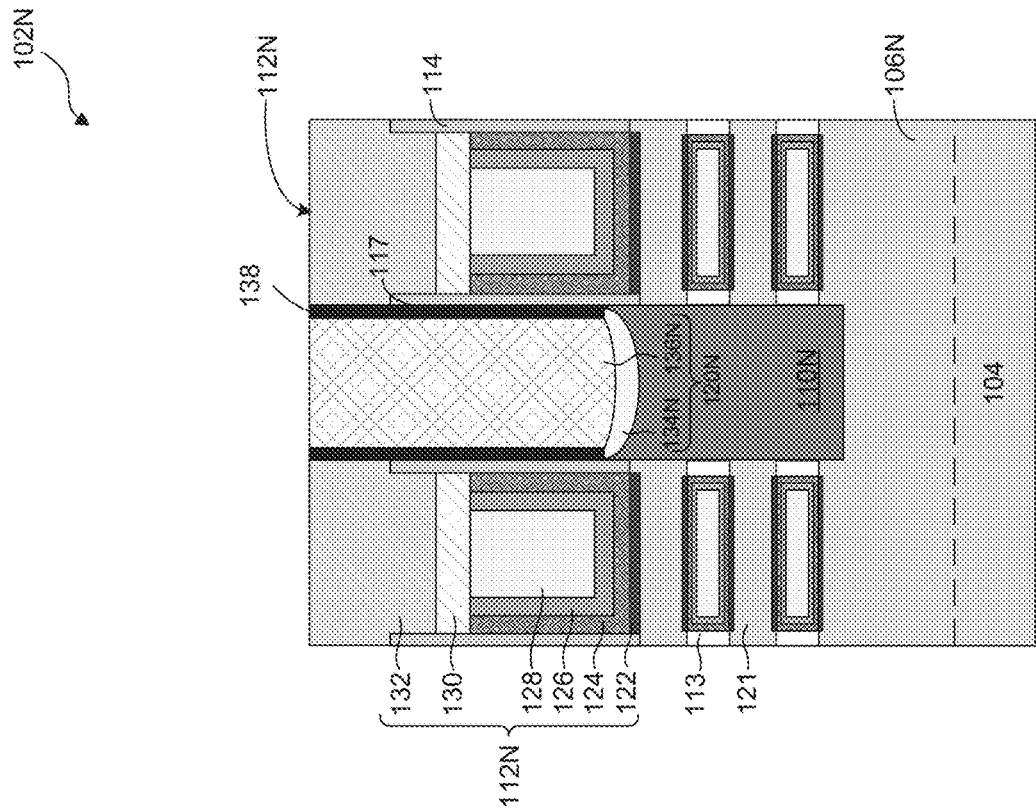

In some embodiments, after the formation of nWFM silicide layers 134N-134P, the unreacted portions of nWFM layer 1534 can be removed by a wet etching process, as shown in FIGS. 16A-16B.

Referring to FIG. 2, in operation 250, contact plugs are formed on nWFM silicide layers within the contact openings. For example, as shown FIGS. 16A-16B, contact plugs 136N-136P are formed on the nWFM silicide layers 134N-134P within contact openings 740.

Figure 17:
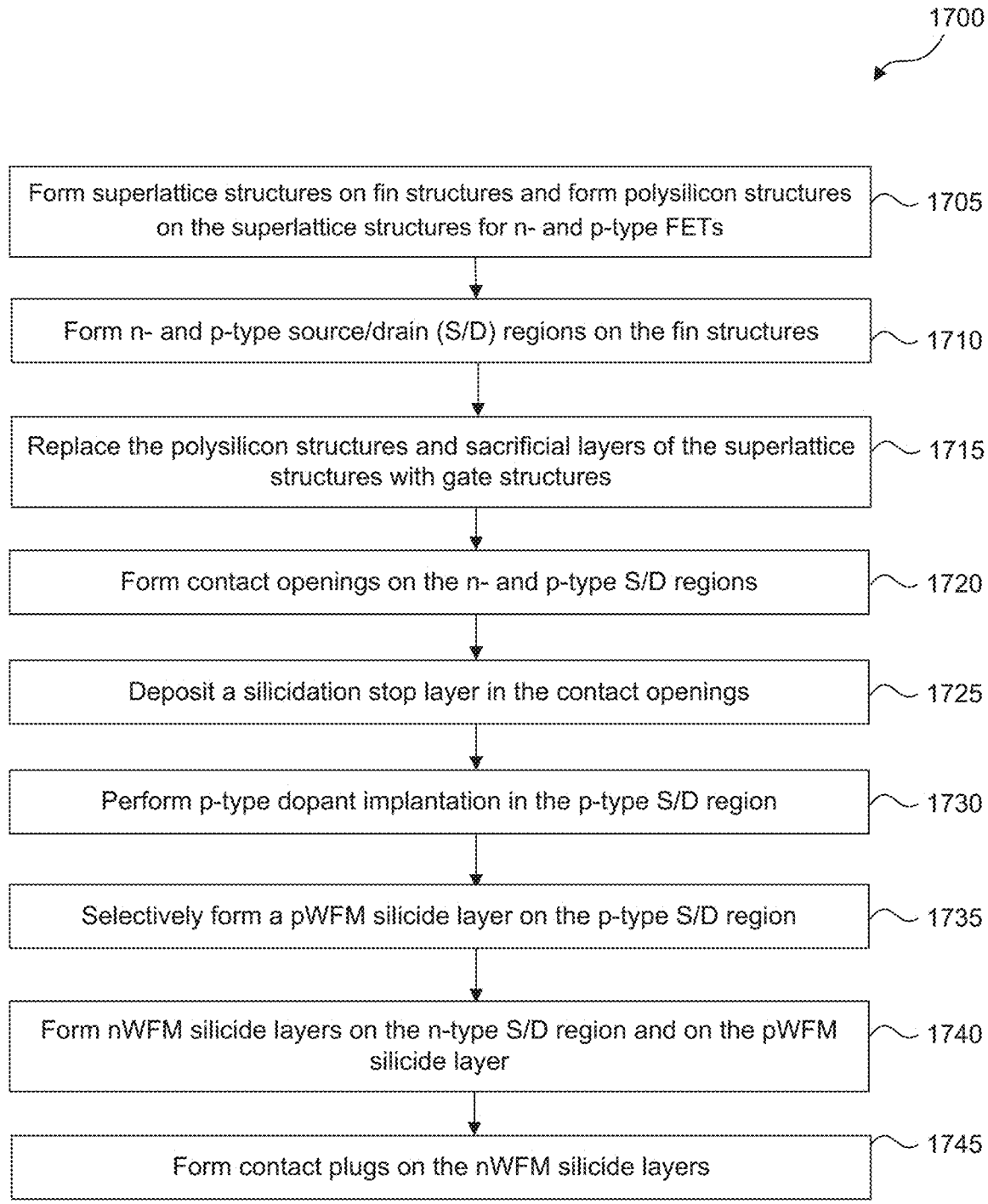
FIG. 17 is a flow diagram of another method for fabricating a semiconductor device with different contact structures, in accordance with some embodiments.

FIG. 17 is a flow diagram of another example method 1700 for fabricating NFET 102N and PFET 102P of semiconductor device 100, according to some embodiments. For illustrative purposes, the operations illustrated in FIG. 17 will be described with reference to the example fabrication process for fabricating NFET 102N and PFET 102P as illustrated in FIGS. 3A-7B and 18A-24B. FIGS. 3A-7A and 18A-24A are cross-sectional views of NFET 102N along line A-A of FIG. 1A, and FIGS. 3B-7B and 18B-24B are cross-sectional views of PFET 102P along line B-B of FIG. 1A at various stages of fabrication, according to some embodiments. Operations can be performed in a different order or not performed depending on specific applications. It should be noted that method 1700 may not produce a complete NFET 102N and PFET 102P. Accordingly, it is understood that additional processes can be provided before, during, and after method 1700, and that some other processes may only be briefly described herein. Elements in FIGS. 18A-24B with the same annotations as elements in FIGS. 1A-1C and 3A-16B are described above.

Referring to FIG. 17, operations 1705-1720 are similar to operations 205-220, respectively. After operation 1720, structures similar to FIGS. 7A-7B are formed, as shown in FIGS. 18A-18B.

Referring to FIG. 17, in operation 1725, a silicidation stop layer is deposited in the contact openings. For example, as shown in FIGS. 19A-19B, a silicidation stop layer 1964 is deposited in contact openings 740. In some embodiments, silicidation stop layer 1964 can include an oxide of a semiconductor material, such as $SiO_x$ and can be deposited using an ALD process. In some embodiments, silicidation stop layer 1964 can have a thickness of about 2 nm to about 10 nm along a Z-axis. If the thickness of silicidation stop layer 1964 is less than 2 nm, silicidation stop layer 1964 may not adequately prevent the formation of pWFM silicides in S/D regions 110N. On the other hand, if the thickness of silicidation stop layer 1964 is greater than 10 nm, the processing time for depositing and removing silicidation stop layer 1964 increases, and consequently increases device manufacturing cost.

Figures 20A, 20B:
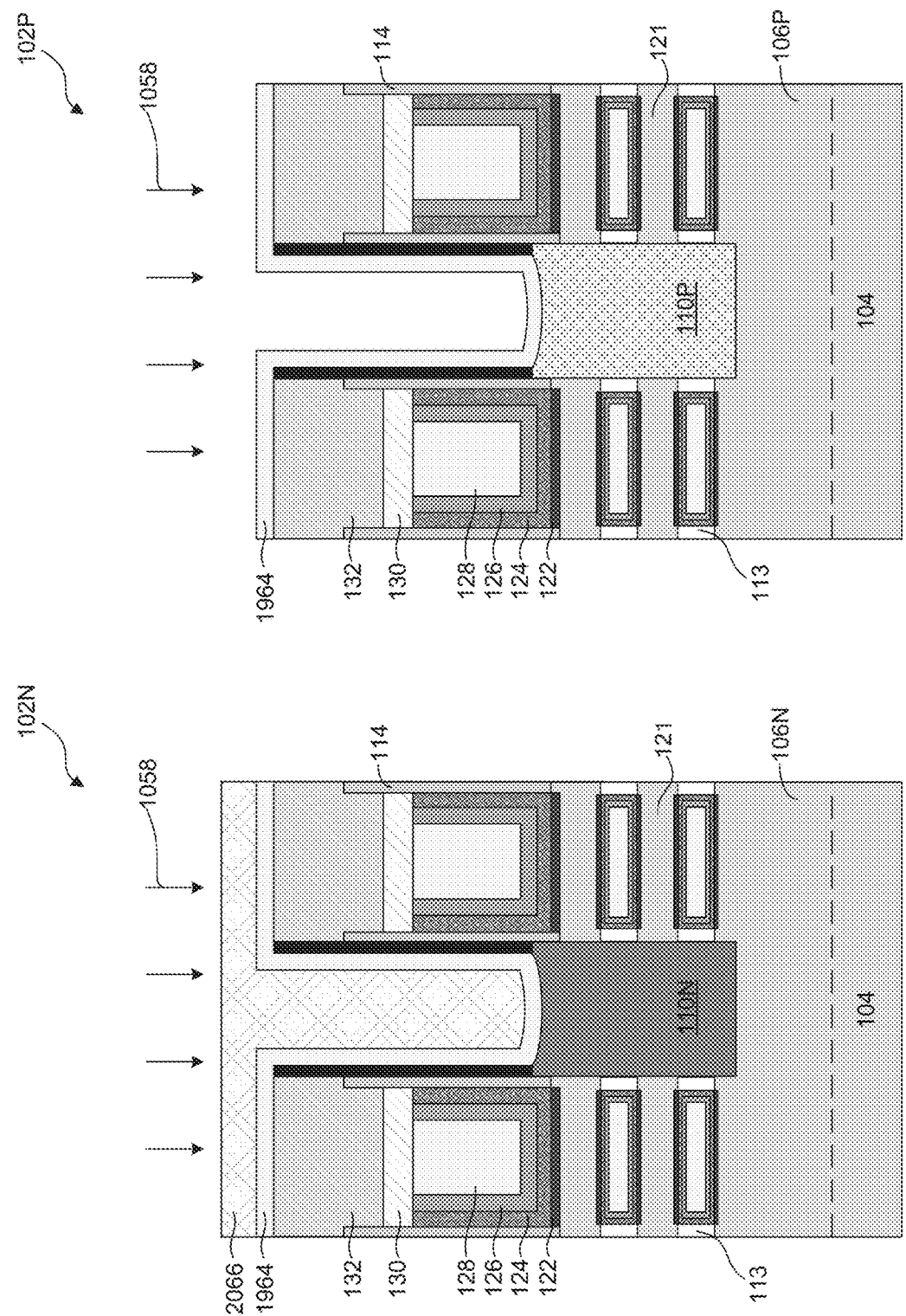
Figures 21A, 21B:
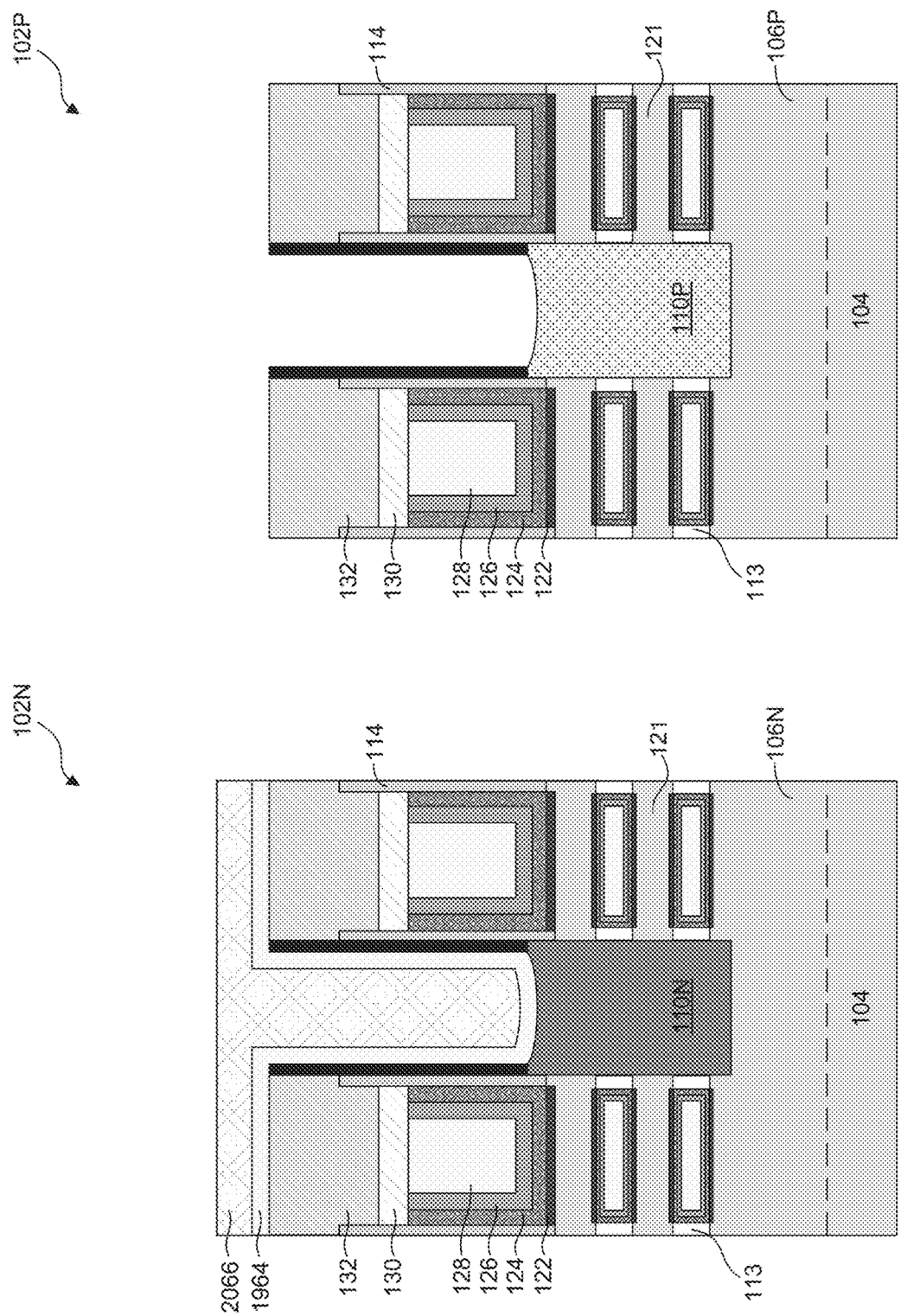
Figures 22A, 22B:
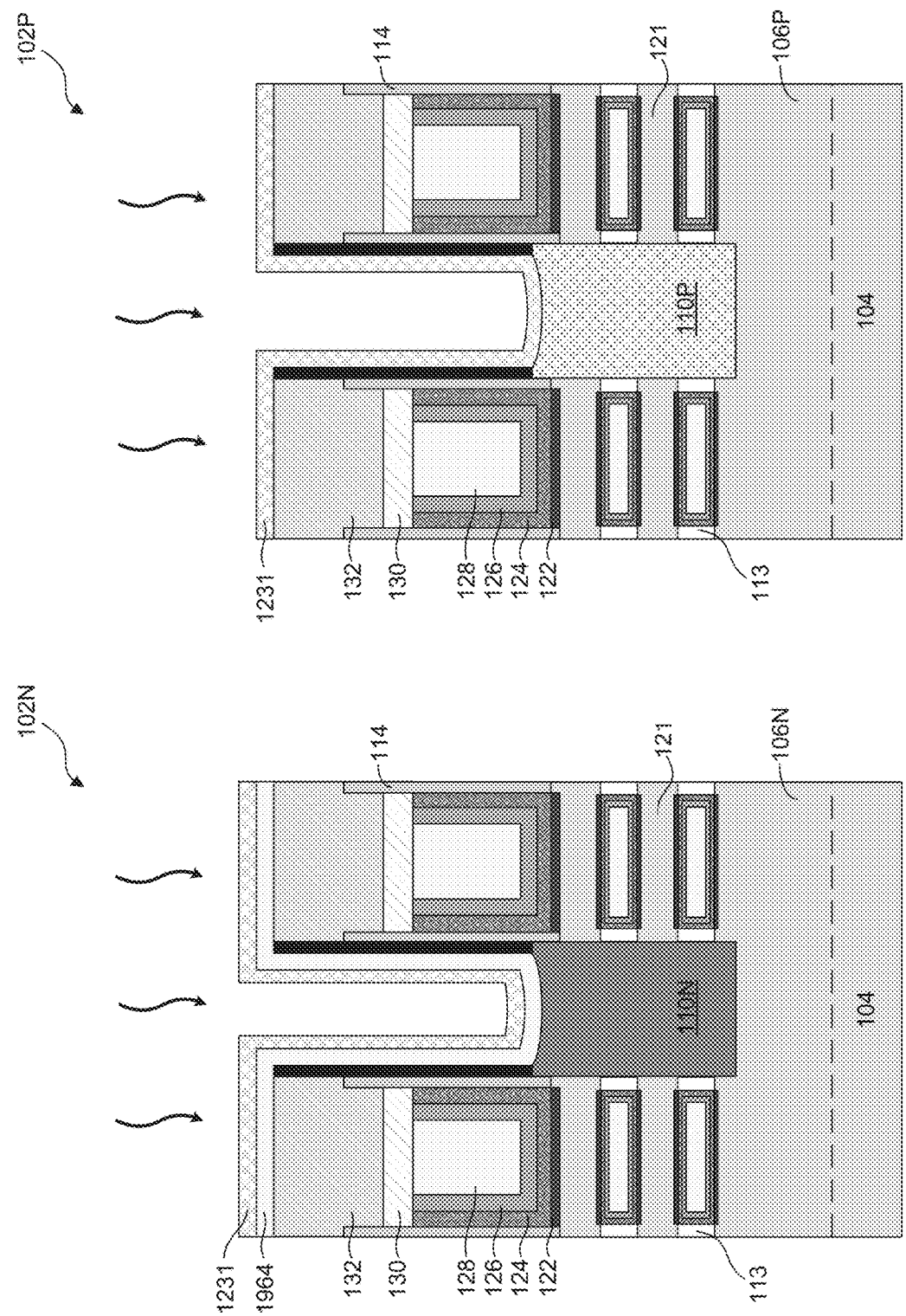

Referring to FIG. 17, in operation 1730, p-type dopants are implanted in the p-type S/D region. For example, as shown in FIGS. 20A-20B, p-type dopants 1058, such as boron are implanted in S/D region 110P. The p-type dopant implantation process can include sequential operations of (i) forming a masking layer 2066 on NFET 102N, as shown in FIG. 20A, and (ii) performing an ion implantation with p-type dopants 1058 on the structures of FIGS. 20A-20B. In some embodiments, a p-type dopant concentration of about $10^{20}$ atoms/cm$^3$ to about $10^{21}$ atoms/cm$^3$ can be implanted in S/D region 110P.

Referring to FIG. 17, in operation 1735, a pWFM silicide layer is selectively formed on the p-type SID region. For example, as described with reference to FIGS. 21A-23B, pWFM silicide layer 131 is selectively formed on SID region 110P. The selective formation of pWFM silicide layer 131 can include sequential operations of (i) performing an etch process (e.g., etching with dilute hydrofluoric acid) on the structures of FIGS. 20A-20B to remove the portion of silicidation stop layer 1964 from the structure of FIG. 20B to form the structure of FIG. 21B, (ii) depositing a pWFM layer 1231 on the structures of FIGS. 21A-21B after removing masking layer 2066 from the structure of FIG. 21A to form the structures of FIGS. 22A-22B, and (iii) performing an anneal process at a temperature of about 400° C. to about 500° con the structures of FIGS. 22A-22B to initiate a silicidation reaction between SID region 110P and the bottom portion of pWFM layer 1231 to form pWFM silicide layer 131, as shown in FIG. 23B.

The portion of pWFM layer 1231 on S/D region 110N does not react with silicidation stop layer 1964 and/or the material of S/D region 110N to form a metal silicide as silicidation stop layer 1964 on S/D region 110N prevents pWFM layer 1231 from reacting with silicidation stop layer 1964 and/or the material of S/D region 110N. The silicon-oxygen (Si—O) bonds of silicidation stop layer 1964 do not break at the silicidation temperature of about 400° C. to about 500° C., and as a result, the silicon atoms of silicidation stop layer 1964 do not react with the metal of pWFM layer 1231 to form a metal silicide.

Figures 23A, 23B:
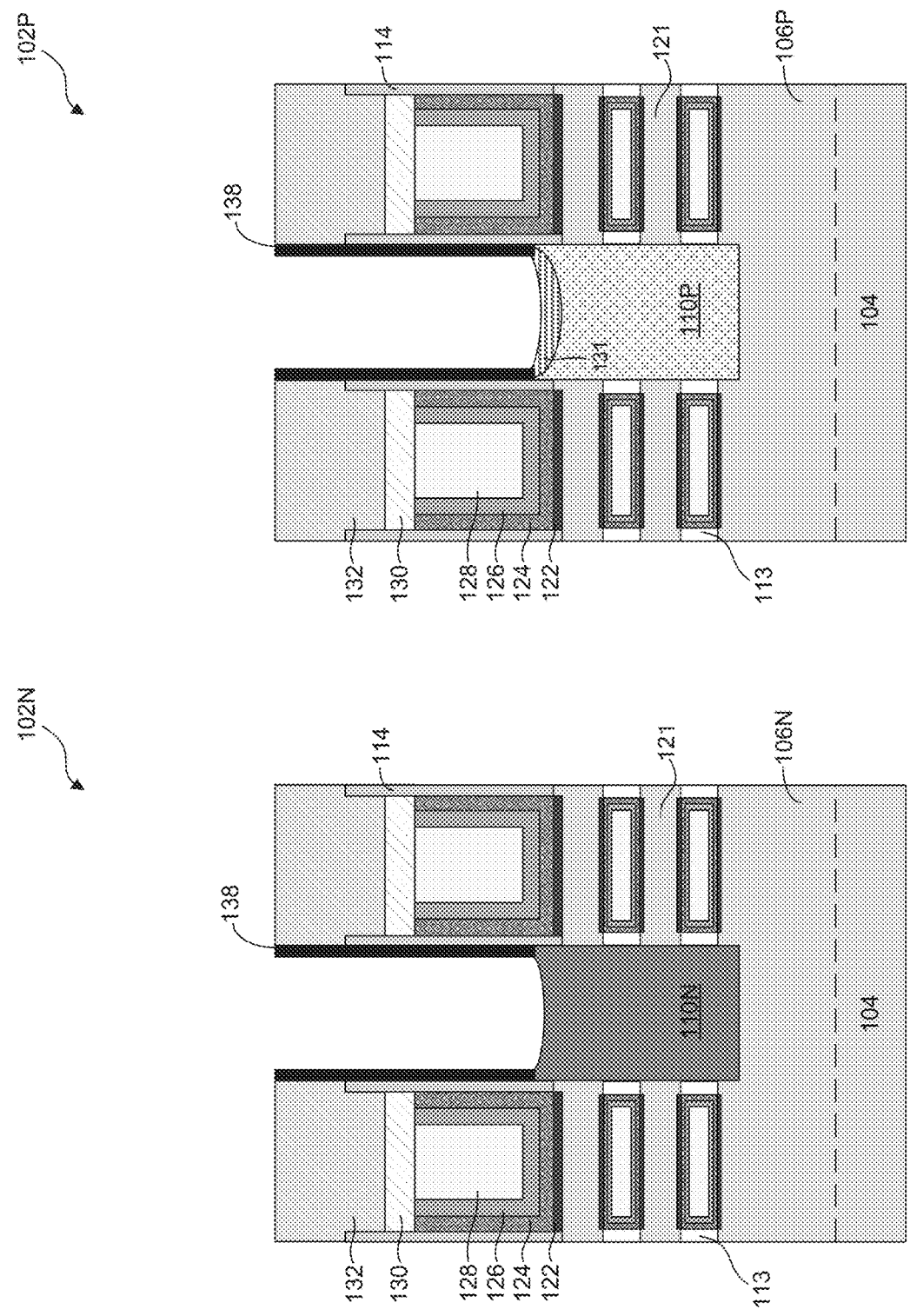

In some embodiments, after the formation of pWFM silicide layer 131, the unreacted portions of pWFM layer 1231, and silicidation stop layer 1964 can be removed by a wet etching process to form the structures of FIGS. 23A-23B.

Figure 24B:
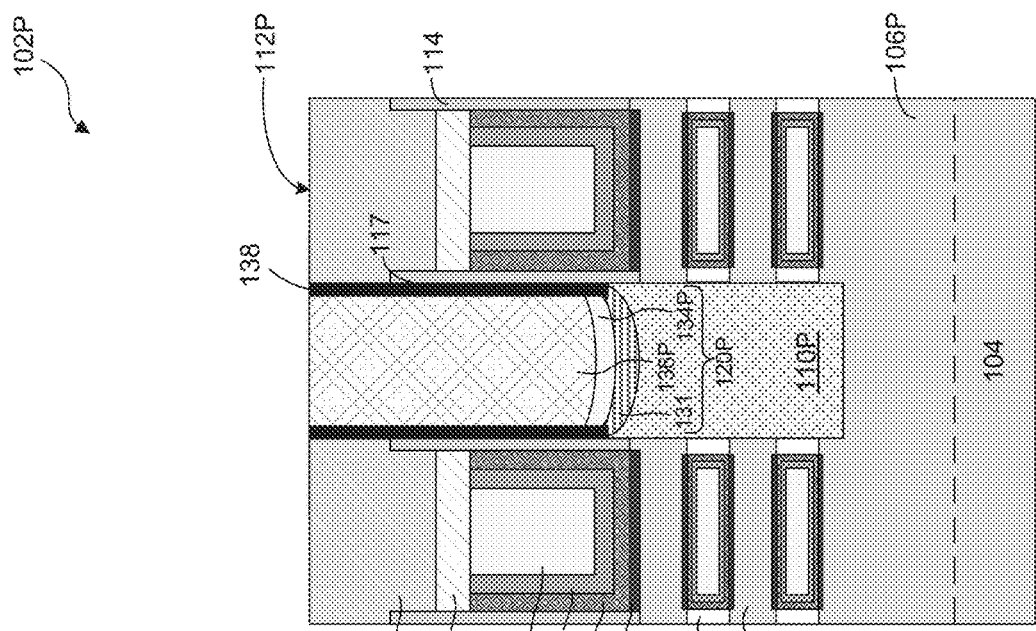
Figure 24A:
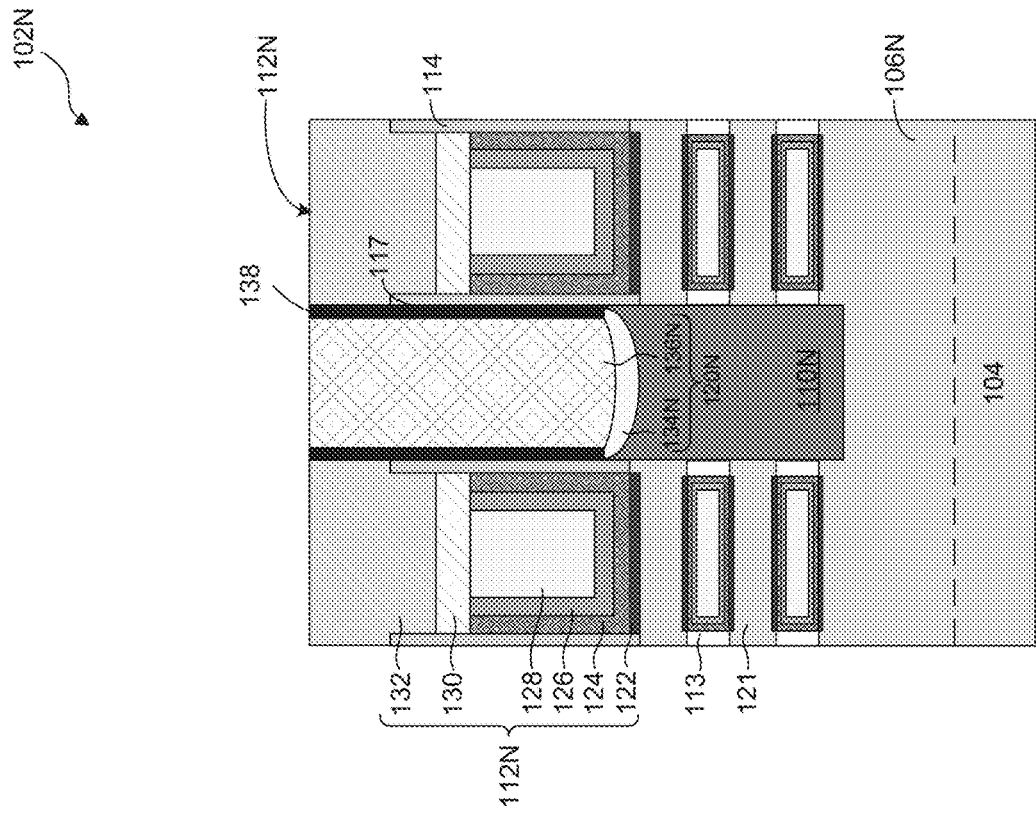

Referring to FIG. 17, operations 1740-1745 are similar to operations 245-250, respectively. After operation 1750, structures of FIGS. 24A-24B are formed.

In some embodiments, nWFM silicide layer 134N formed in method 1700 does not include a metal germanide, unlike nWFM silicide layer 134N formed in method 200. Silicidation stop layer 1964 does not include Ge atoms, and as a result, Ge atoms are not introduced into S/D region 110N from silicidation stop layer 1964, as can be introduced into S/D region 110N from silicidation stop layer 944 in operation 230 of method 200. In some embodiments, nWFM silicide layer 134N can include a metal silicide, such as titanium silicide ($Ti_xSi_y$), tantalum silicide ($Ta_xSi_y$), molybdenum silicide ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide (ThxSiy), or a combination thereof.

The present disclosure provides example semiconductor devices with FETs (e.g., GAA FETs 102N-102P) having source/drain (S/D) contact structures different from each other and provides example methods of forming such contact structures with silicidation stop layers. The example method forms arrays of n- and p-type S/D regions on fin structures of n-type FETs (NFETs) and p-type FETs (PFETs), respectively, of the semiconductor device. In some embodiments, contact structures on n-type S/D regions have silicide layers (also referred to as "silicide-germanide layers" herein, unless mentioned otherwise) different from silicide layers of contact structures on p-type S/D regions.

In some embodiments, pWFM silicide layers (e.g., pWFM silicide layer 131) of the PFET S/D contact structures (e.g., contact structure 120P) are selectively formed on the p-type S/D regions (e.g., S/D region 110P). In contrast, nWFM silicide layers (e.g., nWFM silicide layer 134N) of the NFET S/D contact structures (e.g., contact structure 120N) are formed on the n-type S/D regions (e.g., S/D region 110N) and pWFM silicide layers. The pWFM silicide layers can be formed from a silicidation reaction between the p-type S/D regions and a pWFM layer (e.g., pWFM layer 1231) disposed on the p-type S/D regions. The nWFM silicide layers can be formed from a silicidation reaction between the n-type S/D regions and an nWFM layer (e.g., nWFM layer 1534) disposed on the n-type S/D regions and the pWFM silicide layers.

In some embodiments, the method (e.g., methods 200 and 1700) of selectively forming pWFM silicide layers on p-type S/D regions includes forming silicidation stop layers (e.g., silicidation stop layers 944 and 1964) on n-type S/D regions prior to depositing pWFM layers on the n- and p-type S/D regions. The silicidation stop layers can prevent silicidation reactions between the pWFM layers and the n-type S/D regions. In some embodiments, forming silicidation stop layers on the n-type S/D regions can include depositing or epitaxially growing a semiconductor material (e.g., semiconductor layer 844) on the n-type S/D regions and oxidizing the semiconductor material. The semiconductor material has a stronger chemical bond with oxygen atoms than with the metal atoms of the pWFM layers. As a result, the oxidized semiconductor material of the silicidation stop layers does not react with the metal of the pWFM layers and prevents chemical interactions between the metal of the pWFM layers and the n-type S/D regions underlying the silicidation stop layers. In some embodiments, oxidation stop layers (e.g., oxidation stop layers 842) can be deposited or epitaxially grown between the silicidation stop layers and the n-type S/D regions to protect the material of the n-type S/D regions from oxidizing during the formation of the silicidation stop layers.

In some embodiments, a method includes forming first and second fin structures on a substrate, forming n- and p-type source/drain (S/D) regions on the first and second fin structures, respectively, forming first and second oxidation stop layers on the n- and p-type S/D regions, respectively, epitaxially growing first and second semiconductor layers on the first and second oxidation stop layers, respectively, converting the first and second semiconductor layers into first and second semiconductor oxide layers, respectively, forming a first silicide-germanide layer on the p-type S/D region, and forming a second silicide-germanide layer on the first silicide-germanide layer and on the n-type S/D region.

In some embodiments, a method includes forming first and second fin structures on a substrate, forming n- and p-type source/drain (S/D) regions on the first and second fin structures, respectively, depositing a silicidation stop layer on the n- and p-type S/D regions, forming a p-type work function metal (pWFM) silicide layer on the p-type S/D region, and forming an n-type work function metal (nWFM) silicide layer on the pWFM silicide layer and on the n-type S/D region.

In some embodiments, as semiconductor device includes a substrate, first and second fin structures disposed on the substrate, first and second gate structures disposed on the first and second fin structures, respectively, first and second source/drain (S/D) region disposed on the first and second fin structures, respectively, a first metal silicide-germanide layer disposed on the first S/D region, a second metal silicide-germanide layer disposed on the first metal silicide-germanide layer and the second S/D region, and first and second contact plugs disposed on the first and second metal silicide-germanide layers, respectively, wherein a metal of the first contact plug is same as a metal of the second contact plug.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming first and second fin structures on a substrate;
    forming n- and p-type source/drain (S/D) regions on the first and second fin structures, respectively;
    forming first and second oxidation stop layers on the n- and p-type S/D regions, respectively;
    epitaxially growing first and second semiconductor layers on the first and second oxidation stop layers, respectively;
    converting the first and second semiconductor layers into first and second semiconductor oxide layers, respectively;
    forming a first silicide-germanide layer on the p-type S/D region; and
    forming a second silicide-germanide layer on the first silicide-germanide layer and on the n-type S/D region.

2. The method of claim 1, wherein forming the first and second oxidation stop layers comprises epitaxially growing silicon layers on the n- and p-type S/D regions.

3. The method of claim 1, wherein epitaxially growing the first and second semiconductor layers comprises epitaxially growing silicon germanium (SiGe) layers on the first and second oxidation stop layers.

4. The method of claim 1, wherein converting the first and second semiconductor layers into the first and second semiconductor oxide layers comprises performing a thermal oxidation process on the first and second semiconductor layers.

5. The method of claim 1, wherein converting the first semiconductor layer into the first semiconductor oxide layer comprises converting a first portion of the first semiconductor layer into a silicon oxide (SiOx) layer and a second portion of the first semiconductor layer into a silicon germanium oxide (SiGeOx) layer.

6. The method of claim 1, wherein forming the first silicide-germanide layer comprises removing the second semiconductor oxide layer.

7. The method of claim 1, wherein forming the first silicide-germanide layer comprises removing the second oxidation stop layer.

8. The method of claim 1, wherein forming the first silicide-germanide layer comprises depositing a p-type work function metal (pWFM) layer on the first semiconductor oxide layer and on the p-type S/D region.

9. The method of claim 1, wherein forming the second silicide-germanide layer comprises depositing an n-type work function metal (nWFM) layer on the first silicide-germanide layer and on the n-type S/D region.

10. The method of claim 1, further comprising performing a p-type dopant implantation on the second semiconductor oxide layer.

11. A method, comprising:
    forming first and second fin structures on a substrate;
    forming n- and p-type source/drain (S/D) regions on the first and second fin structures, respectively;
    depositing a silicidation stop layer on the n- and p-type S/D regions;
    forming a p-type work function metal (pWFM) silicide layer on the p-type S/D region; and
    forming an n-type work function metal (nWFM) silicide layer on the pWFM silicide layer and on the n-type S/D region.

12. The method of claim 11, wherein depositing the silicidation stop layer comprises depositing a semiconductor oxide layer or a silicon oxide layer on the n- and p-type S/D regions.

13. The method of claim 11, further comprising:
    forming a first stack of first and second nanostructured layers in an alternating configuration on the first fin structure, wherein the first and second nanostructured layers comprise semiconductor materials different from each other; and forming a second stack of third and fourth nanostructured layers in an alternating configuration on the second fin structure, wherein the third and fourth nanostructured layers comprise semiconductor materials different from each other.

14. The method of claim 11, further comprising performing a p-type dopant implantation on a portion of the silicidation stop layer on the p-type S/D region.

15. The method of claim 11, wherein forming the pWFM silicide layer comprises removing a portion of the silicidation stop layer on the p-type S/D region.

16. The method of claim 11, wherein forming the nWFM silicide layer comprises removing a portion of the silicidation stop layer on the n-type S/D region.

17. A semiconductor device, comprising:
a substrate;
first and second fin structures disposed on the substrate;
a stack of first nanostructured layers disposed on a first portion of the first fin structure;
a stack of second nanostructured layers disposed on a first portion of the second fin structure;
a first gate structure surrounding at least one of the first nanostructured layers;
a second gate structure surrounding at least one of the second nanostructured layers;
first and second source/drain (S/D) regions disposed on second portions of the first and second fin structures, respectively;
a first metal silicide-germanide layer disposed on the first S/D region;
a second metal silicide-germanide layer disposed on the first metal silicide-germanide layer and the second S/D region; and
first and second contact plugs disposed on the first and second metal silicide-germanide layers, respectively, wherein a metal of the first contact plug is same as a metal of the second contact plug.

18. The semiconductor device of claim 17, wherein a metal of the first metal silicide-germanide layer is different from a metal of the second metal silicide-germanide layer.

19. The semiconductor device of claim 17, wherein the first metal silicide-germanide layer comprises a p-type work function metal (pWFM) silicide-germanide layer.

20. The semiconductor device of claim 17, wherein the second metal silicide-germanide layer comprises an n-type work function metal (nWFM) silicide-germanide layer.

* * * * *